(12) United States Patent
Takahashi et al.

(10) Patent No.: US 6,558,871 B1
(45) Date of Patent: May 6, 2003

(54) PHOTOCURABLE COMPOSITION CONTAINING IODONIUM SALT COMPOUND

(75) Inventors: Eiji Takahashi, Ichihara (JP); Akihiro Shirai, Ichihara (JP); Hiroshi Takahashi, Ichihara (JP); Shinichi Kimizuka, Ichihara (JP)

(73) Assignee: Nippon Soda Co. Ltd., Tokyo (JP)

( * ) Notice: Subject to any disclaimer, the term of this patent is extended or adjusted under 35 U.S.C. 154(b) by 0 days.

(21) Appl. No.: 09/646,700

(22) PCT Filed: Mar. 18, 1999

(86) PCT No.: PCT/JP99/01351
§ 371 (c)(1),
(2), (4) Date: Sep. 19, 2000

(87) PCT Pub. No.: WO99/48945
PCT Pub. Date: Sep. 30, 1999

(30) Foreign Application Priority Data

| Mar. 20, 1998 | (JP) | 10-090671 |
|---|---|---|
| Mar. 20, 1998 | (JP) | 10-090672 |
| Mar. 23, 1998 | (JP) | 10-092187 |
| Mar. 30, 1998 | (JP) | 10-099961 |
| Aug. 11, 1998 | (JP) | 10-226844 |

(51) Int. Cl.$^7$ .............................................. G03F 7/004
(52) U.S. Cl. ...................... 430/270.1; 430/914; 552/31; 570/101
(58) Field of Search .......................... 430/270.1, 914; 522/31; 570/101; 568/337, 56, 74, 28

(56) References Cited

U.S. PATENT DOCUMENTS

| 4,529,490 A | | 7/1985 | Crivello et al. | |
|---|---|---|---|---|
| 4,548,890 A | * | 10/1985 | Dickinson et al. | 430/280 |
| 4,603,101 A | | 7/1986 | Crivello | |
| 4,607,116 A | * | 8/1986 | Yamazaki et al. | 560/12 |
| 4,656,229 A | | 4/1987 | Chiao | |
| 4,683,317 A | | 7/1987 | Crivello et al. | |
| 4,840,977 A | | 6/1989 | Crivello et al. | |
| 5,101,053 A | * | 3/1992 | Boettcher | 556/64 |
| 5,130,392 A | * | 7/1992 | Schwalm et al. | 526/288 |
| 5,426,222 A | * | 6/1995 | Wargo et al. | 562/602 |
| 6,187,836 B1 | * | 2/2001 | Oxman et al. | 522/148 |
| 6,413,696 B1 | * | 7/2002 | Pang et al. | 430/280.1 |
| 6,416,939 B1 | * | 7/2002 | Shimada et al. | 430/325 |

FOREIGN PATENT DOCUMENTS

| JP | 09-124533 | * | 5/1997 |
|---|---|---|---|
| JP | 11-153870 | * | 6/1999 |

OTHER PUBLICATIONS

CA 125:168750.*
CA 54:9824f.*
CA 128: 140480.*
CA 76:141325.*
CA 105:209386.*
He, J. et al, J.Polym.Sci, Part. A, 34, 1996, 2809–2816.*
CA abstract vol. 54, 9824f.*
Chemical Abstracts, 54, 9824f.*
CA 118:21999.*
CA 103:53793.*
CA 79:42151.*
Chemical Abstract AN 1997:413175, JP 09–124533, May 1997.*
Chemical Abstract AN 1999:365907, JP 11–153870, Jun. 1999.*
Chemical Abstract AN 1988:38334, Leeson, P.D., et al. J. Med. Chem. 31(1), 1988, 37–54.*

* cited by examiner

Primary Examiner—Rosemary Ashton
(74) Attorney, Agent, or Firm—Dennis G. LaPointe

(57) ABSTRACT

A photopolymerization initiator comprising an iodonium salt compound; and a photocurable composition containing the compound. The composition is a photocurable cationic composition which cures in a short time upon irradiation with actinic energy rays. They are based on the following findings: (1) a colorless lowly toxic iodonium salt compound can be easily synthesized in high yield when a specific substrate is used as a starting material; (2) a photocurable composition curing in a short time to give a cured article having excellent material properties is obtained by using the iodonium salt compound in combination with a sensitizer; and (3) a highly sensitive photocurable composition which upon irradiation with actinic energy rays cures in a short time to give a cured article having excellent material properties is obtained by using a compound having a group functioning as a cationic photopolymerization initiator, a sensitizing group accelerating the phtoinitiated cationic reaction, and a cationically polymerizable group in the same molecule.

13 Claims, No Drawings

US 6,558,871 B1

PHOTOCURABLE COMPOSITION CONTAINING IODONIUM SALT COMPOUND

FIELD OF THE INVENTION

The present invention is related to a photopolymerization initiator comprising an iodonium salt compound and to a photocurable composition containing the said photopolymerization initiator. More particularly, the present invention is directed to a cationically photocurable composition which is cured in a short time upon irradiation with actinic energy rays, such as light, electron rays and X-rays. Since the cured article of the photocurable composition has the excellent material properties, it can be suitably used for coating materials, adhesives, photoresists, inks, silicon release, etc.

The present invention is also directed to a photocurable composition and more particularly to a cationically photocurable composition having an excellent photocurable property and/or a sensitized cationically photocurable composition. The photocurable composition of the present invention is able to be cured upon irradiation with actinic energy rays, such as light, electron rays and X-rays, and it can be suitably used for coating materials, adhesives, inks, photoresists and photosensitive resins for photomolding because it has an excellent long wavelength sensitizing property. Further, the present invention is also directed to a photocuring process for a photocurable composition containing a pigment, a novel compound to be used for the photocurable composition described above having a group functioning as a cationic photopolymerization initiator and a cationically polymerizable group in the molecule, a novel compound having a group functioning as a cationic photopolymerization initiator, a sensitizing group accelerating photoinitiated cationic reaction and a cationically polymerizable initiator, and a process for preparing such compounds.

BACKGROUND ART

In Japanese Patent laid-open gazettes with No. Sho 50-151996, No. Sho 60-47028, etc., iodonium salt compounds similar to the iodonium salt compound specified in the present invention are disclosed, and wherein it is described that these iodonium salt compounds can be used as a catalyst for curing cationically polymerizable compounds, such as epoxy compounds, upon irradiation with light, electron rays and radiation such as X-rays.

In general, iodonium salt compounds have problems such as low solubility to monomers and high toxicity. As a means to solve such problems, it is preferable to introduce a functional group thereinto to enable various modification. However, in case of synthesizing compounds described in the Japanese Patent laid-open gazettes, No. Sho 50-151996 and No. 60-47029 mentioned above, there are many groups, such as alkyl, alkoxy and carbonyl, which are hard to be chemically modified in those compounds, and coloring to those compounds during the synthesis may be caused in many cases. On the other hand, the yield for an iodonium salt compound wherein a chemically-modifiable functioning group such as carboxyl is directly introduced is known as low as much as 20% more or less.

It is known that the photocurable property of an iodonium salt compound is remarkably decreased when the counter anion thereof is hexafluorophosphonate, tetrafluoroborate or the like, except hexafluoroantimonate and tetraperfluorophenylborate. Therefore, the iodonium salt compounds having such counter anion are not suitable for photocuring clear system compositions and pigment-containing compositions. Whereas, some dyestuff derivatives and thioxanthone derivatives are known as an effective sensitizer for those iodonium salt compounds, however, none of sensitizers usable for the clear system compositions and the ones that are usable for pigment-containing compositions, cheap, giving less color and very effective have been known.

An object of the present invention is to provide a photocurable composition containing an iodonium salt compound, being synthesized easily at a high yield, highly sensitive to actinic energy rays, such as light, electron rays and X-rays, having high solubility in a monomer, less colored, less toxic, able to cure irrespective of clear system compositions or pigment-containing compositions in a short time even its counter anion is hexafluorophosphate, tetrafluoroborate or the like, and the cured articles thereof has the excellent material properties.

DISCLOSURE OF THE INVENTION

The inventors of the present invention had worked for finding an iodonium salt compound capable of solving the problems as described above and had found that the less toxic iodonium salt compound giving less color can be easily synthesized at a high yield by using a specific substrate as the starting material. Further, the inventors had found that a photocurable composition having the excellent material properties and being curable in a short time upon irradiation with actinic energy rays, such as light, electron ray and X-ray, particularly a pigment-containing photocurable composition, is obtainable by using the iodonium salt compound and a sensitizer in combination. Furthermore, the inventors had also found that a photocurable composition using a compound in which a group functioning as a cationic photopolymerization initiator, a sensitizing group accelerating the photoinitiated cationic reaction and a cationically polymerizable group, or, a compound in which a group functioning as a cationic photopolymerization initiator, particularly an onium salt compound, and a cationically polymerizable group, are contained in the molecule can be cured with high sensitivity in a short time upon irradiation with actinic rays, such as light, electron ray or X-ray, and the cured article of the photocurable composition shows to have excellent material properties.

The present invention is directed to a photopolymerization initiator characterized in that the photopolymerization initiator comprises at least one of diaryliodonium salt compounds represented by a general formula (I);

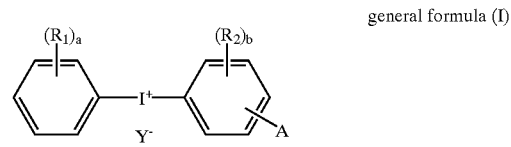

general formula (I)

wherein $R_1$ and $R_2$ represent each independently hydrogen, optionally-substituted alkyl, optionally-substituted cycloalkyl, optionally-substituted alkoxy, or carboxyl or its ester, a and b represent each independently an integer selected from 1 to 4, provided, when a and/or b are 2 or more, the corresponding 2 or more substituents, $R_1$ and/or $R_2$ may be the same or different group, and Y- represents non-nucleophilic anion residue, A represents any one group selected from a substituent group represented by the following formulas,

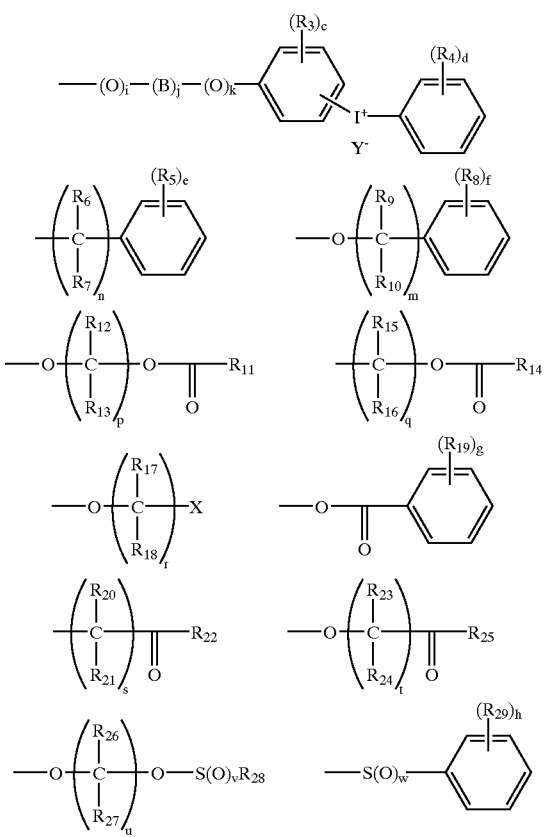

B represents optionally-substituted alkylene or optionally-substituted phenylene, i, j and k represent each independently 0 or 1, provided, all of i, j and k never be 0 at the same time, and i, j and k cannot be 1, 0 and 1 simultaneously, $R_3$, $R_4$, $R_5$, $R_8$, $R_{19}$ and $R_{29}$ represent each independently hydrogen, halogeno, optionally-substituted alkyl, optionally-substituted cycloalkyl, optionally-substituted phenyl, optionally-substituted alkoxy, optionally-substituted cycloalkoxy, optionally-substituted phenoxy, or carboxyl or its ester, $R_6$, $R_7$, $R_9$, $R_{10}$, $R_{12}$, $R_{13}$, $R_{15}$, $R_{16}$, $R_{17}$ and $R_{18}$ represent each independently hydrogen, optionally-substituted alkyl, optionally-substituted cycloalkyl or optionally-substituted phenyl, c, d, e, f, g and h represent each independently an integer selected from 1 to 5, provided, when c, d, e, f, g and/or h are 2 or more, the corresponding 2 or more substituents, $R_3$, $R_4$, $R_5$, $R_8$, $R_{19}$ and $R_{29}$, may be the same or different group, n, m, p, q, r, s, t and u represent each independently an integer selected from 1 to 8, provided, when n, m, p, q, r, s, t and/or u are 2 or more, the corresponding 2 or more substituents, $R_6$, $R_7$, $R_9$, $R_{10}$, $R_{12}$, $R_{13}$, $R_{15}$, $R_{16}$, $R_{17}$, $R_{18}$, $R_{20}$, $R_{21}$, $R_{23}$, $R_{24}$, $R_{26}$ and $R_{27}$, may be the same or different group, $R_{11}$, $R_{14}$, $R_{25}$ and $R_{28}$ represent each independently hydrogen, optionally-substituted alkyl, optionally-substituted cycloalkyl, or optionally-substituted phenyl, $R_{22}$ represents hydrogen, optionally-substituted alkyl, optionally-substituted cycloalkyl, optionally-substituted phenyl or optionally-substituted alkoxy, v and w represent each independently 1 or 2, and X represents halogeno.

The present invention is also directed to a photocurable composition containing at least one of the iodonium salt compounds represented by the general formula (I) and a cationically polymerizable compound, to the photocurable composition further containing a sensitizer, to the sensitizer-containing photocurable composition wherein the sensitizer is one or two compounds selected from a group consisting of 9,10-dialkoxyanthracene derivatives, phenanthrene derivatives, thioxanthone derivatives, carbazole derivatives and naphthalene derivatives, to the photocurable composition further containing a pigment, and to the photocurable composition further containing a radically polymerizable compound.

The present invention is further directed to a compound having a group functioning as a cationic photopolymerization initiator and a cationically polymerizable group in the molecule, and a compound having a group functioning as a cationic photopolymerization initiator, a sensitizing group accelerating the photoinitiated cationic reaction and a cationically polymerizable group in the molecule.

The present invention is again directed to a compound having a group functioning as a cationic photopolymerization initiator in the molecule and the said group is a group having an onium salt structure, and to a photocurable composition characterized by containing the said compound in which the onium salt compound is consisted of a diaryliodonium salt derivative or a triarylsulfonium derivative, a compound having a group functioning as a cationic photopolymerization initiator and a cationically polymerizable group in the molecule, and a compound having a group functioning as a cationic photopolymerization initiator, a sensitizing group accelerating the photoinitiated cationic reaction and a cationically-polymerizable group in the molecule.

For the general formula (I), $R_1$ and $R_2$ represent each independently hydrogen, optionally-substituted alkyl, optionally-substituted cycloalkyl or optionally-substituted alkoxy, or carbonyl or its ester, a is an integer selected from 1 to 4, b is an integer selected from 1 to 4, provided, when a and/or b are 2 or more, respectively, the corresponding 2 or more substituents, $R_1$ and/or $R_2$, may be the same or different group. As examples for the substituents represented by $R_1$ and $R_2$, methyl, ethyl, isopropyl, cyclopropyl, methoxycarbonylmethyl, benzyl, 2-acetoxyethyl, acetylmethyl, methoxy, isopropoxy, benzyloxy, methoxycarbonylmethoxy, 2-acetoxyethoxy, 2-chloroethoxy, acetylmethoxy, 2-methanesulfonyloxyethoxy, benzoyloxy, carboxyl, methoxycarboxyl, phenylsulfonyl or the like can be given.

There is no limitation in the position and the numbers for the substitution described above, and a represents an integer selected from 1 to 5 and b represents an integer selected from 1 to 4, provided, when a and/or b are 2 or more, respectively, the corresponding 2 or more substituents, $R_1$ and $R_2$, may be the same or different group. In particular, it is preferable when the substitutional position for the group represented by $R_1$ is any of 4-, 2,4,6- and 3-.

A represents any one group selected from the substituent group drawn in the following, and it is preferable when the substitutional position for A is 2- or 4- though there is no limitation in the substitutional position for the group.

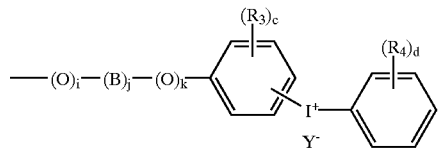

-continued

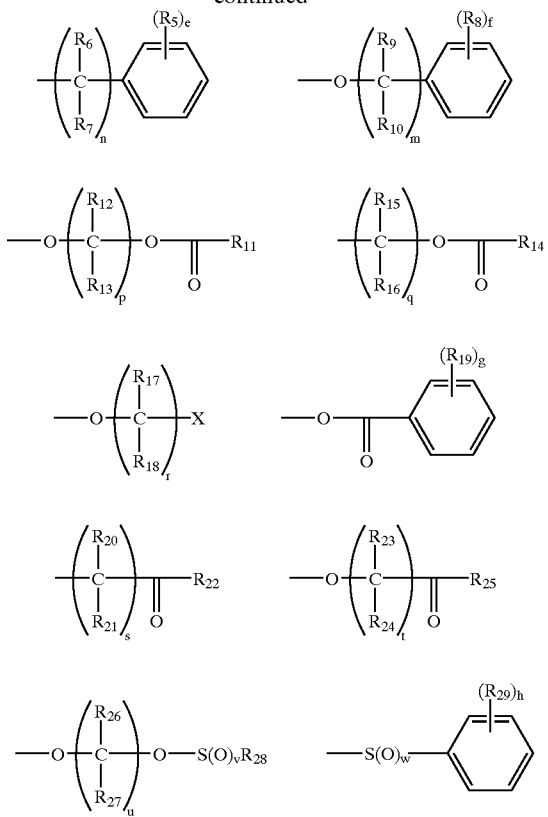

In the general formulas recited above, substituents, $R_3$, $R_4$, $R_5$, $R_8$, $R_{19}$ and $R_{29}$ represent each independently hydrogen, halogeno, optionally-substituted alkyl, optionally-substituted cycloalkyl, optionally-substituted phenyl, optionally-substituted alkoxy, optionally-substituted cycloalkoxy, optionally-substituted phenoxy, or carboxyl or its ester. As concrete examples for such substituents, hydrogen, chlorine, bromine, fluorine, methyl, isopropyl, trifluoromethyl, cyclopropyl, p-tolyl, methoxy, trifluoromethoxy, cyclopropyloxy, 4-chlorophenoxy, carboxyl, methoxycarbonyl and the like can be given. There is no limitation for the position and the numbers of the substituent, and c, d, e, f, g and h represent each independently an integer selected from 1 to 5. When the integer is 2 or more, the corresponding two or more substituents to the integer, namely $R_3$, $R_4$, $R_5$, $R_8$, $R_{19}$ or $R_{29}$, may be each independently the same or different group. More particularly, for the case of $R_4$, it means that $R_4$ may include a substituent like 2-methyl-4-carboxyl.

$R_6$, $R_7$, $R_9$, $R_{10}$, $R_{12}$, $R_{13}$, $R_{15}$, $R_{16}$, $R_{17}$, $R_{18}$, $R_{20}$, $R_{21}$, $R_{23}$, $R_{24}$, $R_{26}$ and $R_{27}$ represent each independently hydrogen, optionally-substituted alkyl, optionally-substituted cycloalkyl, or optionally-substituted phenyl. As concrete examples for the substituents mentioned above, hydrogen, methyl, chloromethyl, cyclopropyl, cyclohexyl, phenyl, tolyl or the like can be given. n, m, p, q, r, s, t and u represent each independently an integer selected from 1 to 8. When the integer is 2 or more, the corresponding two or more substituents to the integer, namely $R_6$, $R_7$, $R_9$, $R_{10}$, $R_{12}$, $R_{13}$, $R_{15}$, $R_{16}$, $R_{17}$, $R_{18}$, $R_{20}$, $R_{21}$ $R_{23}$, $R_{24}$, $R_{26}$ or $R_{27}$, may be each independently the same or different group.

$R_{11}$, $R_{14}$, $R_{25}$ and $R_{28}$ represent each independently hydrogen, optionally-substituted alkyl, optionally-substituted cycloalkyl or optionally-substituted phenyl.

More particularly, hydrogen, methyl, trifluoromethyl, chloromethyl, cyclopropyl, cyclohexyl, phenyl, tolyl, p-chlorophenyl or the like can be given as examples for such substituents.

$R_{22}$ represents hydrogen, optionally-substituted alkyl, optionally-substituted phenyl or optionally-substituted alkoxy. More particularly, hydrogen, methyl, trifluoromethyl, chloromethyl, cyclopropyl, cyclohexyl, phenyl, tolyl, p-chlorophenyl, methoxy, benzyloxy or the like can be given as the examples for the substituent represented by $R_{22}$.

B represents optionally-substituted alkylene or optionally-substituted phenylene, and more particularly, it represents methylene, ethylene, 1,1-dimethylmethylene, 1-methyl-ethylene, phenylene, 2-methylphenylene or the like.

i, j and k represent each independently 0 or 1, provided, that all of them never be 0 at the same time and there is no case of i=1, j=0 and k=1, simultaneously. As the concrete examples, the following groups can be given.

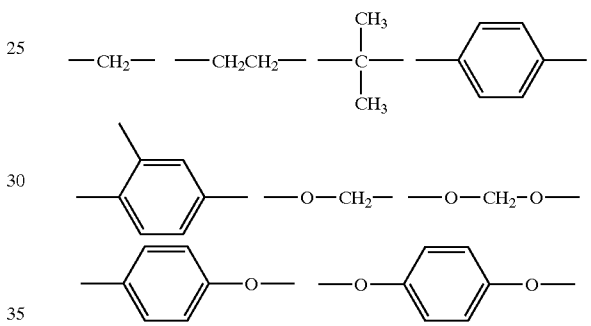

v and w represent each independently 0 or an integer of 1 or 2. X represents halogeno, and more particularly, X represents chlorine, bromine, fluorine, iodine and the like.

In the general formula (I) described above, Y represents non-nucleophilic anion residue, and as the concrete examples thereof, $SbF_6$, $AsF_6$, $PF_6$, $BF_4$, $(F_5C_5)_4B$ and the like can be given.

As examples for the compounds represented by the general formula (I), the followings can be given.

(Compound 1)

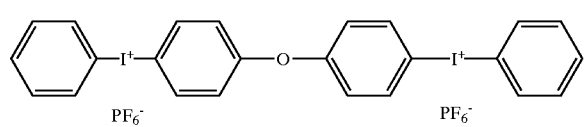

$^1$H NMR $(CD_3)_2SO$ δ 7.19, 8.26 (8H, 2d, $IC_6H_4O$), 7.54, 7.69, 8.26 (10H, t, t, d, $C_6H_6I$).

(Compound 2)

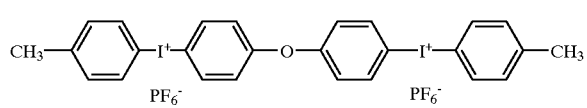

$^1$H NMR $((CD_3)_2SO)$ δ 2.35 (6H, s, $CH_3$), 7.17, 8.22 (8H, 2d, $IC_6H_4O$), 7.35, 8.12 (8H, 2d, $CH_3C_6H_4I$).

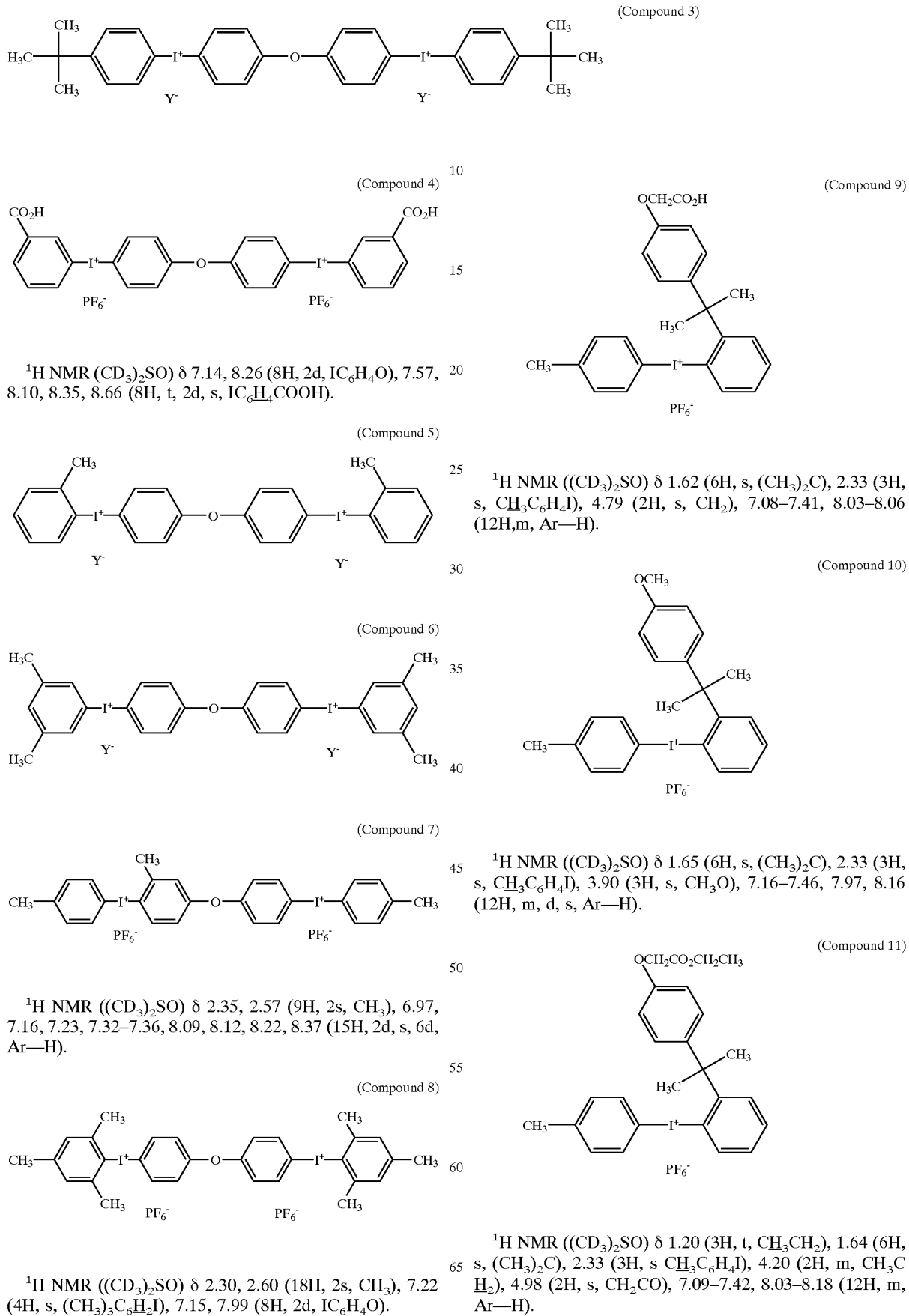

¹H NMR (CD₃)₂SO) δ 7.14, 8.26 (8H, 2d, IC₆H₄O), 7.57, 8.10, 8.35, 8.66 (8H, t, 2d, s, IC₆$\underline{H}$₄COOH).

¹H NMR ((CD₃)₂SO) δ 1.62 (6H, s, (CH₃)₂C), 2.33 (3H, s, C$\underline{H}$₃C₆H₄I), 4.79 (2H, s, CH₂), 7.08–7.41, 8.03–8.06 (12H, m, Ar—H).

¹H NMR ((CD₃)₂SO) δ 2.35, 2.57 (9H, 2s, CH₃), 6.97, 7.16, 7.23, 7.32–7.36, 8.09, 8.12, 8.22, 8.37 (15H, 2d, s, 6d, Ar—H).

¹H NMR ((CD₃)₂SO) δ 1.65 (6H, s, (CH₃)₂C), 2.33 (3H, s, C$\underline{H}$₃C₆H₄I), 3.90 (3H, s, CH₃O), 7.16–7.46, 7.97, 8.16 (12H, m, d, s, Ar—H).

¹H NMR ((CD₃)₂SO) δ 2.30, 2.60 (18H, 2s, CH₃), 7.22 (4H, s, (CH₃)₃C₆$\underline{H}$₂I), 7.15, 7.99 (8H, 2d, IC₆H₄O).

¹H NMR ((CD₃)₂SO) δ 1.20 (3H, t, C$\underline{H}$₃CH₂), 1.64 (6H, s, (CH₃)₂C), 2.33 (3H, s C$\underline{H}$₃C₆H₄I), 4.20 (2H, m, CH₃C$\underline{H}$₂), 4.98 (2H, s, CH₂CO), 7.09–7.42, 8.03–8.18 (12H, m, Ar—H).

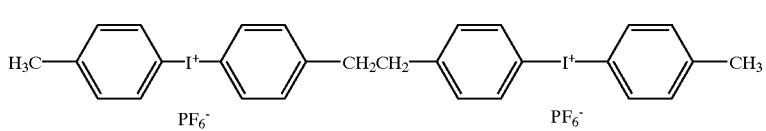
(Compound 12)

$^1$H NMR ((CD$_3$)$_2$SO) δ 2.32 (3H, s, CH$_3$), 2.88 (4H, s, CH$_2$), 7.28–7.33, 8.02–8.06 (16H, 4d, Ar—H).

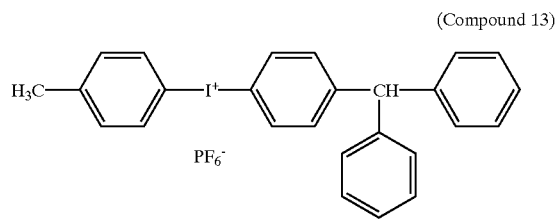
(Compound 13)

$^1$H NMR ((CD$_3$)$_2$SO) δ 2.34 (3H, s, CH$_3$), 5.72 (1H, s, CH), 7.00–8.16 (18H, m, Ar—H).

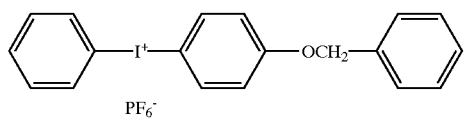
(Compound 14)

$^1$H NMR ((CD$_3$)$_2$SO) δ 5.19 (2H, s, CH$_2$), 7.16, 8.18 (4H, 2d, IC$_6$H$_4$O), 7.33–8.44 (5H, m, CH$_2$C$_6$H$_5$), 7.52, 7.66, 8.20 (5H, 2t, d, C$_6$H$_5$I).

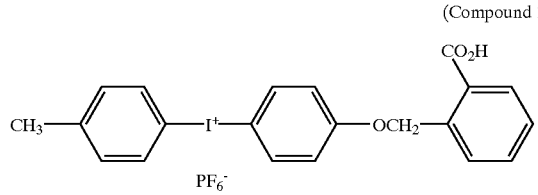
(Compound 15)

$^1$H NMR ((CD$_3$)$_2$SO) δ 2.34 (3H, s, CH$_3$C$_6$H$_4$), 5.49 (2H, s, OCH$_2$), 7.11, 0.14 (4H, 2d, IC$_6$H$_4$O), 7.333, 8.09 (4H, 2d, CH$_3$C$_6$H$_4$I), 7.43–7.59, 7.94 (4H, m, d, C$_6$H$_4$COOH).

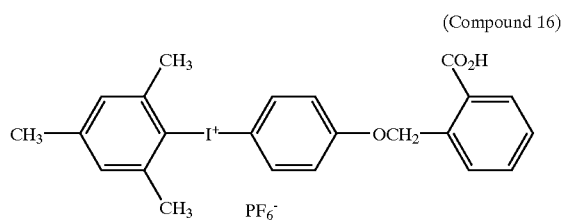
(Compound 16)

$^1$H NMR ((CD$_3$)$_2$SO) δ 2.26, 2.60 (9H, 2s, CH$_3$), 5.44 (2H, s, CH$_2$), 7.05, 7.92 (4H, 2d, IC$_6$H$_4$O), 7.17 (2H, s, (CH$_3$)C$_6$H$_2$I), 7.40–7.52, 7.87 (4H, m, C$_6$H$_4$CO$_2$H).

(Compound 17)

CH$_2$=CHCOCH$_2$CH$_2$O—⟨⟩—I$^+$—⟨⟩—OCH$_2$CH$_2$OCCH=CH$_2$
         ∥                                    ∥
         O                                    O $^1$H NMR ((CD$_3$)$_2$SO) δ 4.22–4.47 (8H, m, CH$_2$CH$_2$), 5.95–6.33 (6H, m, CH=CH$_2$), 7.20, 8.12 (8H, 2d, C$_6$H$_4$).

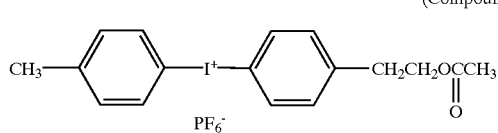
(Compound 18)

$^1$H NMR ((CD$_3$)$_2$SO) δ 2.01 (3H, s, CH$_3$CO), 2.34 (3H, s, CH$_3$C$_6$H$_4$), 4.25–4.32 (4H, m, CH$_2$), 7.09, 8.14 (4H, 2d, IC$_6$H$_4$O), 7.33, 8.08 (4H, 2d, CH$_3$C$_6$H$_4$I).

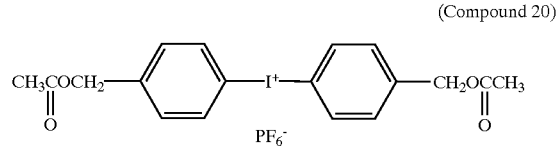
(Compound 19)

$^1$H NMR ((CD$_3$)$_2$SO) δ 1.94 (3H, s, CH$_3$CO), 2.34 (3H, s, CH$_3$C$_6$H$_4$I), 2.92 (2H, t, CH$_2$C$_6$H$_4$), 4.21 (2H, t, CH$_2$O), 7.34, 8.12 (4H, 2d, CH$_3$C$_6$H$_4$I), 7.41, 8.14 (4H, 2d, IC$_6$H$_4$CH$_2$).

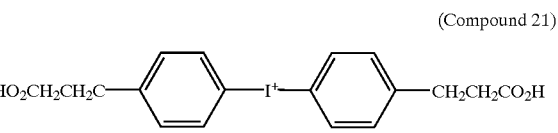
(Compound 20)

$^1$H NMR ((CD$_3$)$_2$SO) δ 2.07 (6H, s, CH$_3$), 5.11 (4H, s, CH$_2$), 7.49, 8.23 (8H, 2d, C$_6$H$_4$).

(Compound 21)

HO$_2$CCH$_2$CH$_2$C—⟨⟩—I$^+$—⟨⟩—CH$_2$CH$_2$CO$_2$H
                       PF$_6^-$ $^1$H NMR ((CD$_3$)$_2$SO) δ 2.93, 4.19 (8H, 2t, CH$_2$), 7.42, 8.16 (8H, 2d, C$_6$H$_4$).

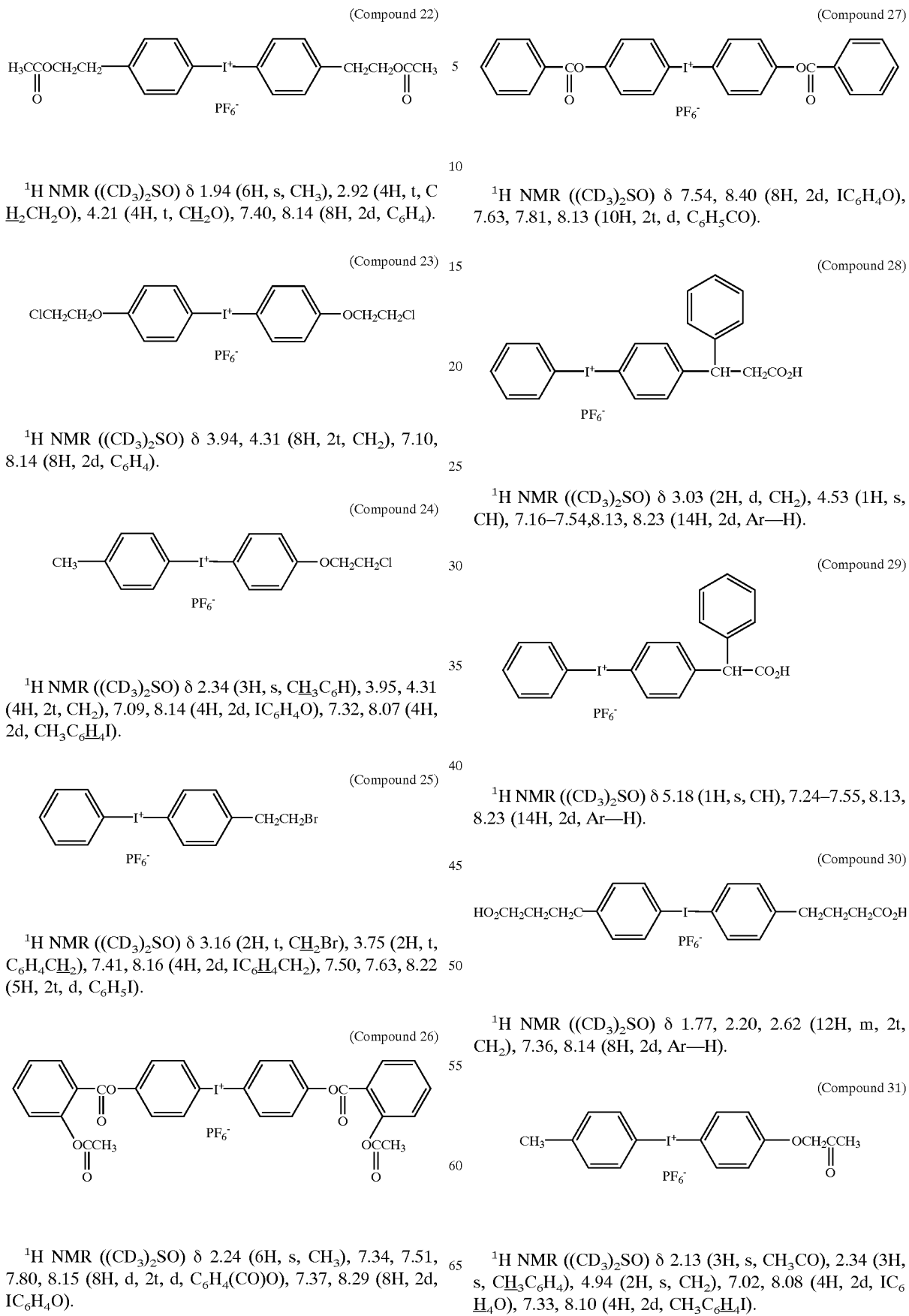

(Compound 22)

$^1$H NMR ((CD$_3$)$_2$SO) δ 1.94 (6H, s, CH$_3$), 2.92 (4H, t, CH$_2$CH$_2$O), 4.21 (4H, t, CH$_2$O), 7.40, 8.14 (8H, 2d, C$_6$H$_4$).

(Compound 23)

$^1$H NMR ((CD$_3$)$_2$SO) δ 3.94, 4.31 (8H, 2t, CH$_2$), 7.10, 8.14 (8H, 2d, C$_6$H$_4$).

(Compound 24)

$^1$H NMR ((CD$_3$)$_2$SO) δ 2.34 (3H, s, CH$_3$C$_6$H), 3.95, 4.31 (4H, 2t, CH$_2$), 7.09, 8.14 (4H, 2d, IC$_6$H$_4$O), 7.32, 8.07 (4H, 2d, CH$_3$C$_6$H$_4$I).

(Compound 25)

$^1$H NMR ((CD$_3$)$_2$SO) δ 3.16 (2H, t, CH$_2$Br), 3.75 (2H, t, C$_6$H$_4$CH$_2$), 7.41, 8.16 (4H, 2d, IC$_6$H$_4$CH$_2$), 7.50, 7.63, 8.22 (5H, 2t, d, C$_6$H$_5$I).

(Compound 26)

$^1$H NMR ((CD$_3$)$_2$SO) δ 2.24 (6H, s, CH$_3$), 7.34, 7.51, 7.80, 8.15 (8H, d, 2t, d, C$_6$H$_4$(CO)O), 7.37, 8.29 (8H, 2d, IC$_6$H$_4$O).

(Compound 27)

$^1$H NMR ((CD$_3$)$_2$SO) δ 7.54, 8.40 (8H, 2d, IC$_6$H$_4$O), 7.63, 7.81, 8.13 (10H, 2t, d, C$_6$H$_5$CO).

(Compound 28)

$^1$H NMR ((CD$_3$)$_2$SO) δ 3.03 (2H, d, CH$_2$), 4.53 (1H, s, CH), 7.16–7.54, 8.13, 8.23 (14H, 2d, Ar—H).

(Compound 29)

$^1$H NMR ((CD$_3$)$_2$SO) δ 5.18 (1H, s, CH), 7.24–7.55, 8.13, 8.23 (14H, 2d, Ar—H).

(Compound 30)

$^1$H NMR ((CD$_3$)$_2$SO) δ 1.77, 2.20, 2.62 (12H, m, 2t, CH$_2$), 7.36, 8.14 (8H, 2d, Ar—H).

(Compound 31)

$^1$H NMR ((CD$_3$)$_2$SO) δ 2.13 (3H, s, CH$_3$CO), 2.34 (3H, s, CH$_3$C$_6$H$_4$), 4.94 (2H, s, CH$_2$), 7.02, 8.08 (4H, 2d, IC$_6$H$_4$O), 7.33, 8.10 (4H, 2d, CH$_3$C$_6$H$_4$I).

(Compound 32)
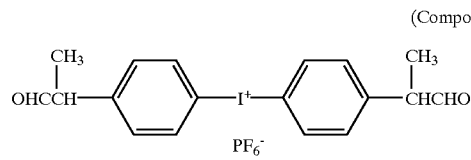
$^1$H NMR ((CD$_3$)$_2$SO) δ 1.25 (6H, d, CH$_3$), 3.22 (2H, m, CH), 7.44, 8.13 (8H, 2d, C$_6$H$_4$).
(Compound 33)
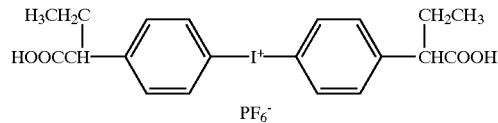
$^1$H NMR ((CD$_3$)$_2$SO) δ 0.79 (6H, t, CH$_3$), 1.63 (4H, m, CH$_2$), 3.50 (2H, d, CH), 7.40, 8.13 (8H, 2d, C$_6$H$_4$).
(Compound 34)
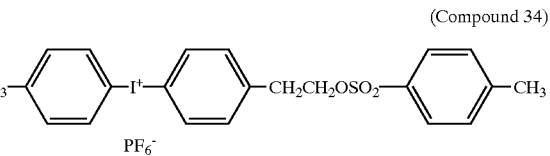
$^1$H NMR ((CD$_3$)$_2$SO) δ 2.34 (3h, s, C$\underline{H}_3$C$_6$H$_4$I), 2.41 (3H, s, C$\underline{H}_3$C$_6$H$_4$SO$_2$), 2.89 (2H, t, C$\underline{H}_2$C$_6$H$_4$), 4.23 (2H, t, CH$_2$O), 7.14–8.14 (18H, m, Ar—H).
(Compound 35)
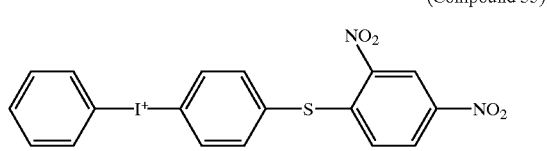
(Compound 36)
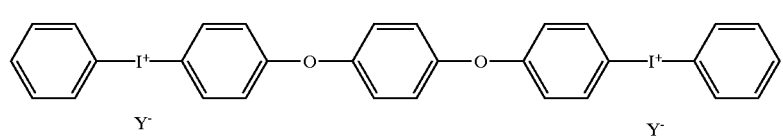
(Compound 37)
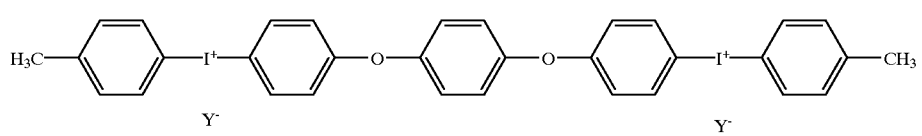
(Compound 38)
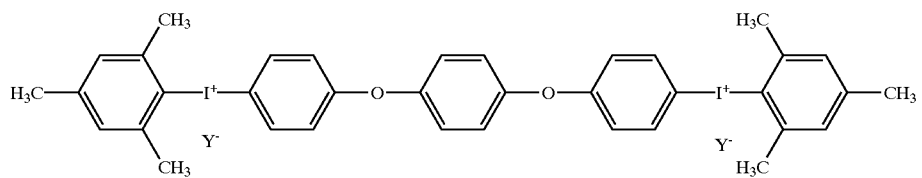
(Compound 39)
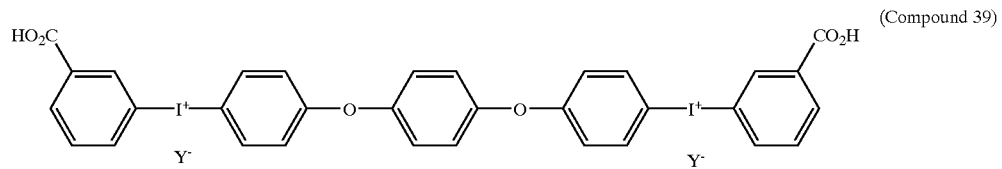

(Compound 40)

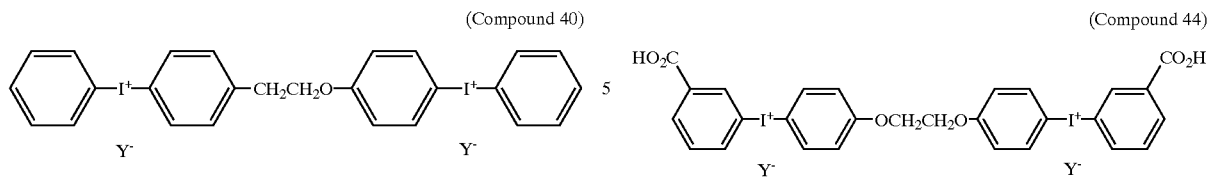

(Compound 44)

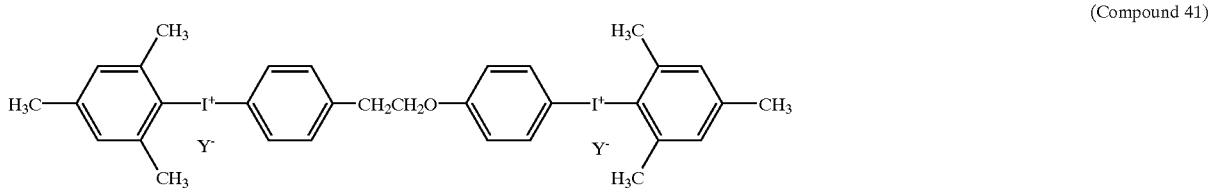

(Compound 41)

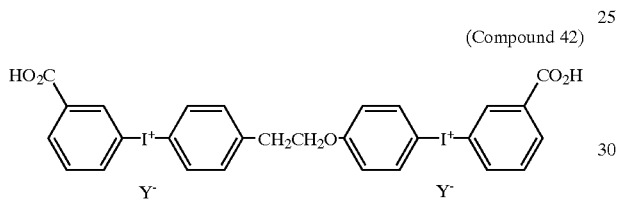

(Compound 42)

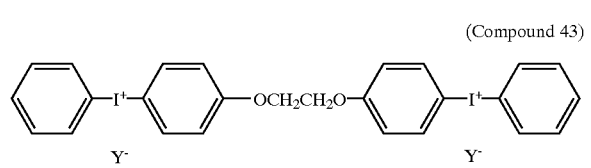

(Compound 43)

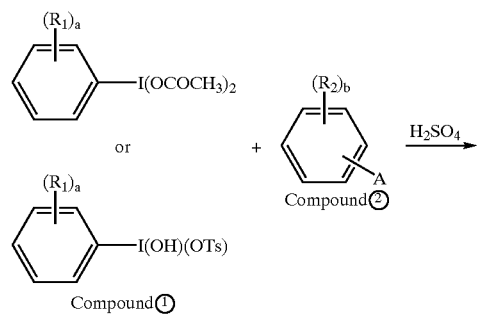

The iodonium salt compounds represented by the general formula (I) of the present invention are prepared according to the reaction formula illustrated below, wherein M represents an alkali metal. The reaction of a compound ① and either a compound ② or a compound ④ with a catalyst, sulfuric acid, is carried out in an organic solvent, such as acetic acid and acetic anhydride, if required, at a temperature of from −20° C. to room temperature for 1 to several ten hours. After completing the reaction, the reacted solution is added with water and stirred. Precipitated compound is either taken out by filtration or extracted with an organic solvent to obtain a compound ③ or a compound ⑤, and desired compound is obtained by applying salt exchange reaction.

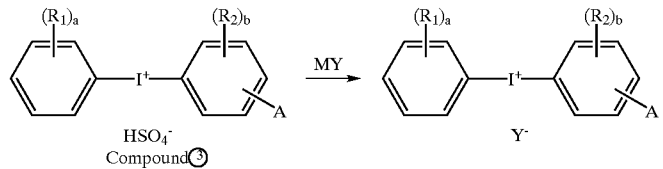

-continued

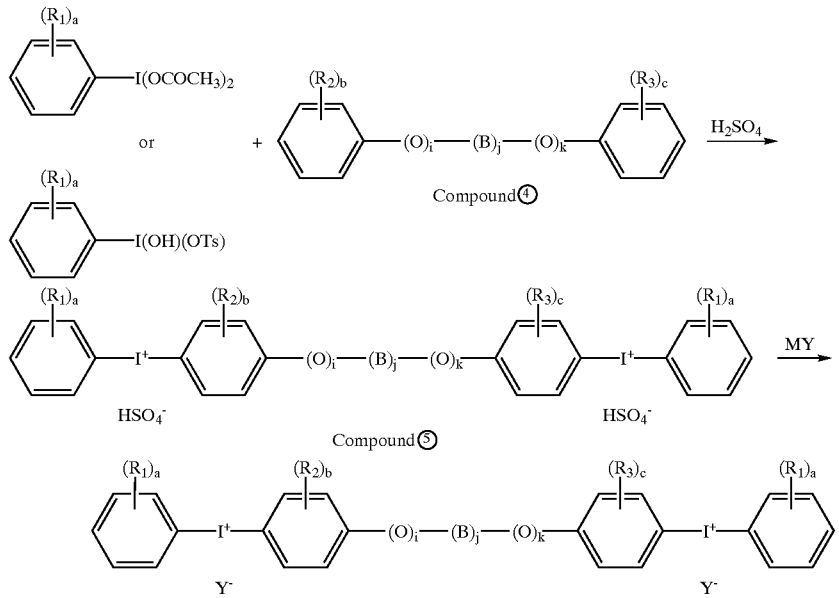

In the reactions illustrated above, $(R_4)_d$ and $(R_1)_a$ represent the same group.

Further, the iodonium salt compounds represented by the general formula (I) of the present invention can be also prepared according to the reaction formula as shown below, wherein M represents an alkali metal. The reaction of a compound ⑥ and potassium iodate with a catalyst, sulfuric acid, is carried out in an organic solvent, such as acetic acid and acetic anhydride, if required, at a temperature of from −20° C. to room temperature for 1 to several ten hours. After completing the reaction, the reacted solution is added with water and stirred. Precipitated compound is either taken out by filtration or extracted with an organic solvent to obtain a compound ⑦ and desired compound is obtained by applying salt exchange reaction.

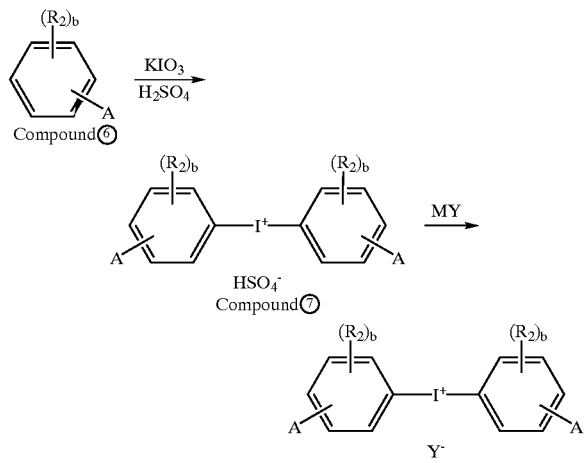

In the reactions illustrated above, $(R_2)_b$ and A are same as $(R_1)_a$.

The iodonium salt compound according to the present invention can cure as a photocurable initiator cationically polymerizable compounds upon irradiation with actinic energy rays, such as light, electron rays and X-rays. As a light source, low-pressure mercury lamp, medium-pressure mercury lamp, high-pressure mercury lamp, super-high pressure mercury lamp, metal halide lamp, xenon lamp, carbon arc lamp and the like are used. Also, the iodonium salt compound can easily cure the cationically polymerizable compounds upon irradiation with laser light, such as semiconductor laser, argon laser and He—Cd laser, and ionizing radiation, such as α-rays, β-rays, γ-rays, neutron beam, X-rays and accelerated electron rays. Further, by using in combination with a sensitizer, the iodonium salt compound can cure the cationically polymerizable compounds, particularly the cationically polymerizable compounds containing a pigment, in a shorter time than that without using a sensitizer.

As the cationically polymerizable compounds to be used in the present invention, any types of monomers, oligomers and polymers having cationically polymerizable property can be used, and as the examples thereof, glycidyl ether type epoxy compounds, alicyclic epoxy compounds, oxirane compounds, such as oxetane compounds, and vinyl ether compounds can be given.

In the following, the cationically polymerizable compounds to be used in the present invention are further explained with concrete examples.

(a) As the vinyl compounds, styrene compounds, such as styrene, α-methylstyrene, p-methoxystyrene and p-t-butoxystyrene, alkylvinyl ether compounds, such as methylvinyl ether, n-butylvinyl ether, ethylvinyl ether, isobutylvinyl ether, cyclohexylvinyl ether, 2-chloroethylvinyl ether, 2-phenoxyethylvinyl ether, 2-hydroxyethylvinyl ether, 4-hydroxybutylvinyl ether, stearylvinyl ether and 2-acetoxyethylvinyl ether, alkenylvinyl ether compounds, such as allylvinyl ether, 2-methacryloyloxyethyl vinyl ether and 2-acryloyloxyethyl vinyl ether, allylvinyl ether compounds, such as phenylvinyl ether and p-methoxyphenylvinyl ether, cationically polymerizable nitrogen-containing compounds, such as N-vinylcarbazole and N-vinylpyrrolidone, multifunctional vinyl compounds, such as butanediol divinyl ether, triethyleneglycol divinyl ether, 1,4-benzenedimethanol divinyl ether, hydroquinone divinyl ether and sazolcinol divinyl ether, propenyl compounds described in Journal of Polymer Science: Part A: Polymer Chemistry, Vol. 32, 2895 (1994), alkoxyallene compounds described in Journal of Polymer Science: Part A: Polymer Chemistry, Vol. 33, 2493 (1995), vinyl compounds described in Journal of Polymer Science: Part A: Polymer Chemistry, Vol.34, 1015 (1996), and isopropenyl compounds described in Journal of Polymer Science: Part A: Polymer Chemistry, Vol. 34, 2051 (1996) can be given as examples.

(b) As the epoxy compounds, monofunctional monomers, such as phenylglycidyl ether, p-tert-butylphenylglycidyl ether, butylglycidyl ether, 2-ethylhexylglycidyl ether, arylglycidyl ether, 1,2-butylene oxide, 1,3-butadiene monoxide, 1,2-dodecylene oxide, epichlorohydrin, 1,2-epoxy decane, ethylene oxide, propylene oxide, styrene oxide, cyclohexene oxide, 3-metacryloyloxymethylcyclohexene oxide, 3-acryloyloxymethylcyclohexene oxide and 3-vinylcyclohexene oxide, and multifunctional epoxy compounds, such as 1,1,3-tetradecadiene dioxide, limonene dioxide, 3,4-epoxycyclohexylmethyl-(3,4-epoxycyclohexyl)carboxylate, di-(3,4-epoxycyclohexyl) adipate, bisphenol A-type epoxy resin, bisphenol F-type epoxy resin, o-, m-, p-cresol novolak-type epoxy resins, phenol novolak-type epoxy resin, polyglycidyl ether of polyhydric alcohol, epoxy silicon, such as K-62-722 manufactured by Shin-etsu Silicon and WV9300 manufactured by Toshiba Silicon, and silicon-containing epoxy compounds described in Journal of Polymer Science: Part A: Polymer Chemistry, Vol. 28, 497 (1990), can be given as examples.

(c) As bicycloorthoester compounds, 1-phenyl-4-ethyl-2,6,7-trioxabicyclo[2,2,2]octane, 1-ethyl-4-hydroxymethyl-2,6,7-trioxabicyclo[2,2,2]octane and the like can be given as examples.

(d) As spiororthoester compounds, 1,5,7,11-tetraoxaspiro[5,5]undecane, 3,9-dibenzyl-1,5,7,11-tetraoxaspiro[4,4]undecane, 1,4,6-trioxaspiro[4,4]nonane, 2-methyl-1,4,6-trioxaspiro[4,4]nonane, 1,4,6-trioxaspiro[4,5]decane and the like can be given as examples.

(e) As the oxetane compounds, 3,3-dimethyloxetane, 3,3-bis(chloromethyl)oxetane, 2-hydroxymethyloxetane, 3-methyl-3-oxetane methanol, 3-methyl-3-methoxymethyloxetane, 3-ethyl-3-phenoxymethyloxetane, resorlcinol bis(3-methyl-3-oxetanylethyl) ether, m-xylylene bis(3-ethyl-3-oxetanylethyl ether) and the like can be given as examples.

All of the compounds recited above can be used either solely or in combination of 2 or more of the compounds.

As the sensitizer to be used in the present invention, any compounds which can accelerate photoreaction of the iodonium salt compound can be used, and as the examples, pigments as described in Journal of Polymer science: Polymer Chemistry Edition, Vol. 16, 2441 (1978), such as acrydine orange, acrydine yellow, pigments, such as benzofuravin, cumarine derivatives and redox system in combination with photoradical initiator, can be used. In addition, phenol derivatives, such as 4-methoxy phenol, 4-benzyloxy phenol, 4-methoxy-2-(t-butyl) phenol, hydroquinone, 4-methoxy-1-naphthol and 2-hydroxydibenzofuran, 1-naphthol, 2-naphthol, 1-methoxynaphthalene, 2-methoxynaphthalene, 1-hydroxyphenathlene, glycidyl-1-naphtyl ether, 2-(2-naphthoxy)ethylvinyl ether, 1,4-dihydroxy naphthalene, 1,5-dihydroxy naphthalene, 1,6-dihydroxy naphthalene, 2,7-dihydroxy naphthalene, 1,1'-thiobis(2-naphthol), 1,1'-bi-2-naphthol, 1,5-naphthyldiglycidyl ether, 2,7-di(2-vinyloxyethyl)naphthyl ether, 4-methoxy-1-naphthol, ESN-175 (epoxy resin manufactured by Shin-nittetsu Kagaku) and its series, epoxy compounds prepared by a reaction of naphthol derivative and epichlorohydrin, condensed compounds of a mixture of naphthol derivative and phenol derivative and formalin, and epoxy compounds prepared by a reaction of the condensed compound and epichlorohydrin, condensed compounds of naphthol derivative and formalin, anthracene derivatives, such as 9,10-dimethoxyanthracene, 2-ethyl-9,10-dimethoxyanthracene, 2-t-butyl-9,10-dimethoxyanthracene, 2,3-dimethyl-9,10-dimethoxyanthracene, 9-methoxy-10-methylanthracene, 9,10-diethoxyanthracene, 2-ethyl-9,10-diethoxyanthracene, 2-t-butyl-9,10-diethoxyanthracene, 2,3-dimethyl-9,10-diethoxyanthracene, 9-ethoxy-10-methylanthracene, 9,10-dipropoxyanthracene, 2-ethyl-9,10-dipropoxyanthracene, 2-t-butyl-9,10-dipropoxyanthracene, 2,3-dimethyl-9,10-dipropoxyanthracene, 9-isopropoxy-10-methylanthracene, 9,10-dibenzyloxyanthracene, 2-ethyl-9,10-dibenzyloxyanthracene, 2-t-butyl-9,10-dibenzyloxyanthracene, 2,3-dimethyl-9,10-dibenzyloxyanthracene, 9-benzyloxy-10-methylanthracene, 9,10-di-α-methylbenzyloxyanthracene, 2-ethyl-9,10-di-α-methylbenzyloxyanthracene, 2-t-butyl-9,10-di-α-methylbenzyloxyanthracene, 2,3-dimethyl-9,10-di-α-methylbenzylanthracene and 9-(α-methylbenzyloxy)-10-methylanthracene, chrysene derivatives, such as 1,4-dimethoxychrysene, 1,4-diethoxychrysene, 1,4-dipropoxychrysene, 1,4-dibenzyloxychrysene and 1,4-di-α-methylbenzyloxychrysene, phenanthrene derivatives, such as 9-hydroxyphenanthrene, 9-methoxyphenanthrene, 9-ethoxyphenanthrene, 9-benzyloxyphenanthrene, 9,10-dimethoxyphenanthrene, 9,10-diethoxyphenanthrene, 9,10-dipropoxyphenanthrene, 9,10-dibenzyloxyphenanthrene, 9,10-di-α-methylbenzyloxyphenanthrene, 9-hydroxy-10-methoxyphenanthrene and 9-hydroxy-10-ethoxyphenanthrene, xanthone derivatives, such as xanthone, thioxanthone and 2,4-diethylthioxanthone, carbazole derivative, such as carbazole, N-vinylcarbazole and N-ethylcarbazole, and the like can be used, however, it is preferable to use 9,10-dialkoxyanthracene derivatives, such as 2-ethyl-9,10-dimethoxyanthracene, phenanthrene derivatives, such as 9,10-dimethoxyphenanthrene, carbazole derivatives, such as N-ethylcarbazole, and naphthalene derivatives, such as 1-naphthol and 2-methoxynaphthalene.

Further, thioxanthones and various dye derivatives commonly known as a sensitizer using for iodonium salt compounds can be used as well. In some cases, the combination of sensitizers, phenanthrene derivative, such as 9,10-dimethoxyphenanthrene, and thioxanthone derivative, such as 2,4-dimethylthioxanthone, shows better performance.

In the present invention, the combination ratio of the iodonium salt compound represented by a general formula (I) and the cationically polymerizable compound can be fixed to 0.01–20 parts (parts by weight, applicable for all parts described hereinbelow) of the iodonium salt compound, more preferably 0.1–10 parts, relative to 100 parts of the cationically polymerizable compound. Curing property of the cationically polymerizable compound deteriorates when the ratio for the iodonium salt compound is too small, whereas the property of the cured article deteriorates when the ratio for the iodonium salt compound is excessive.

Whereas, the combination ratio of the sensitizer and the cationically polymerizable compound can be fixed to 0.001–10 parts of the sensitizer, more preferably 0.01–5 parts, relative to 100 parts of the cationically polymerizable compound. Photoreactivity of the iodonium salt compound being used as a photopolymerization initiator deteriorates when the combination ratio for the sensitizer is too small, whereas the property of the cured article deteriorates when the ratio for the sensitizer is excessive. However, a sensitizer which have cationically polymerizable group, such as epoxy group and vinyl ether group, therein, is exceptional and the combination ratio for them can be optionally modified.

When the photocurable composition of the present invention contains of a pigment, it can be used for inks and photoresists. As examples for the pigment, black pigments, such as carbon black, acetylene black, lamp black and aniline black; yellow pigments, such as chrome yellow, zinc yellow, cadmium yellow, yellow iron oxide, mineral fast yellow, nickel titanium yellow, nables yellow, naphthol yellow S, hanza yellow G, hanza yellow 10G, benzizin yellow G, benzizin yellow GR, quinoline yellow lake, permanent yellow NCG and turtrazin lake; orange pigments, such as red chrome yellow, molybdate orange, permanent orange GTR, pyrazolon orange, balcan orange, indanthrene brilliant orange RK, benzizin orange G and indanthrene brilliant orange GK; red pigments, such as iron oxide red, cadmium red, red lead, cadmium mercury sulfide, permanent red 4R, lisol red, pyrazolon red, watching red calcium salt, lake red D, brilliant carmine 6B, eosine lake, Rhodamine lake B, alizarin lake and brilliant carmine 3B; purple pigments, such as manganese purple, first violet B and methylviolet lake; blue pigments, such as Berlin blue, cobalt blue, alkali blue lake, Victoria blue lake, phthalocyanine blue, metal-free phthalocyanine blue, partially-chlorinated phthalocyanine blue, first sky blue, and indanthrene blue BC; green pigments, such as chrome green, chrome oxide, pigment green B, malachite green lake and final yellow green; white pigments, such as zinc white, titanium dioxide, antimony white and zinc sulfide; and fillers, such as baryta powder, barium carbonate, clay, silica, white carbon, talc and alumina white, can be given. And, when the photocurable composition contains of a pigment, it is preferable to use any of the sensitizers described above.

A radically polymerizable compound can be used for controlling the material and curing property of the cured article of the phorocurable composition according to the present invention. As the radically polymerizable compounds to be used in the present invention, any types of monomers, oligomers and polymers which have radically polymerizable property can be used, however, it is particularly preferable to use unsaturated ester type compounds. For examples, as the radically polymerizable monomer, monofunctional and multifunctional acrylate monomer and metacrylate monomer can be used. As the radically polymerizable oligomer, epoxyacrylate, epoxymetacrylaye, polyester acrylate, polyester metacrylate, polyether acrylate, polyether metacrylate, polyurethane acrylate, polyurethane metacrylate, polybutadiene acrylate, polybutadiene metacrylaye and the like can be used. And, as examples for the radically polymerizable polymer, acrylates, such as polyester, polybutadiene, polyether, urethane and epoxy, metacrylate compounds, unsaturated polyesters and the like can be given.

Whereas, as examples for the radically polymerizable reactive diluent, acrylic acid ester monomers, such as acrylic acid and ethylacrylate, metacrylic acid ester monomers, such as metacrylic acid and methylmetacrylate, styrene and the like can be given.

Another type of the photocurable compound of the present invention uses a compound which has a group functioning as a cationic photopolymerization initiator, a sensitizing group accelerating the photoinitiated cationic reaction and a group having a cationically polymerizable property in the same molecule of the component compound of the present invention, or it contains a compound having a group functioning as a cationic photopolymerization initiator and cationically polymerizable group, a cationically polymerizable compound, and additives, such as pigments and radically polymerizale compounds, if required.

As examples for the compound containing a group functioning as a cationic photopolymerization initiator, a sensitizing group accelerating the photoinitiated cationic reaction and a cationically polymerizable group, compounds containing as a group functioning as a cationic photopolymerization initiator and a group having an onium salt structure, such as ammonium salts, phosphonium salts and iodonium salts, or a group having a triarylsulfonium salt structure or a diaryliodonium salt structure, which are described in JP laid-opens Nos. Sho 50-151996 gazette, Sho 50-151997 gazette, Sho 50-158680 gazette, Hei 1-96169 gazette, Hei 2-1470 gazette, Hei 2-255646 gazette, Hei 2-268173 gazette, Hei 2-178303 gazette, Hei 3-11044 gazette, Hei 3-115262 gazette, Hei 4-1177 gazette, Hei 4-327574 gazette, Hei 4-308563 gazette, Hei 4-328106 gazette, Hei 5-132461 gazette, Hei 5-132462 gazette, Hei 5-140132 gazette, Hei 5-140209 gazette, Hei 5-140210 gazette, Hei 5-170737 gazette, Hei 5-230190 gazette, Hei 5-230189 gazette, Hei 6-271532 gazette, Hei 6-271544 gazette, Hei 6-321897 gazette, Hei 6-321195 gazette, Hei 6-345726 gazette, Hei 6-345733 gazette, Hei 6-814754 gazette, Hei 7-25852 gazette, Hei 7-25863 gazette, Hei 7-89909 gazette, etc., and compounds consisting of an onium salt compound having a sensitizing group accelerating the photoinitiated cationic reaction and a cationically polymerizable group as substituents, preferably a diaryliodonium salt derivative or a triarylsulfonium salt derivative, can be given. These compounds recited above can be used either solely or as the polymer thereof. Among the compounds described above, it is particularly preferable to use diaryliodonium salts or triphenylsulfonium salts in view of photoreactivity and stability under preservation.

As the sensitizing group accelerating the photoinitiated cationic reaction contained in the compound having a group functioning as cationic photopolymerization initiator, a sensitizing group accelerating the photoinitiated cationic reaction and a cationically polymerizable group, any group can be used if it can strengthen the catalytic activity on the photocurable property, however, it is preferable to use a group having at least one as a substituent selected from hydroxy, optionally-substituted aralkyloxy and optionally-substituted alkoxy and containing polycyclic aromatic group having a UV absorbance spectrum at a wavelength longer than 330 nm, or a group having UV absorbance spectrum at a wavelength longer than 330 nm and having a carbazole structure. For example of the structure of the sensitizer, a structure of the compound described above functioning as a sensitizer and a structure of the analogs thereof can be given.

Among these compounds having such structures, 9,10-dialkoxyanthracene derivatives, such as 2-ethyl-9,10-dimethoxyanthracene, thioxanthone derivatives of 2,4-diethylthioxanthone and the like, carbazole derivatives of N-ethylcarbazole and the like, naphthalene derivatives, such as 1-naphthol and 2-methoxynaphthalene, and phenanthrene derivatives, such as 9,10-dimethoxyphenanthrene, are preferable, and in some cases, it is also possible to further effectively give sensitizing effect by combining sensitizing groups, such as phenanthrene derivative like 9,10-dimethoxyphenanthrene and thioxanthone derivative like 2,4-diethylthioxanthone.

As the cationically polymerizable group contained in either the compound of the present invention having a group functioning as a cationic photopolymerization initiator, a sensitizing group accelerating the photoinitiated cationic reaction and a cationically polymerizable group in the molecule or the compound of the present invention having a group functioning as a cationic photopolymerization initiator and a cationically polymerizable group in the molecule, similar cationically polymerizable groups in commonly-known cationically polymerizable compounds, such as the monomers, oligomers and polymers as described above, can be used, however, it is preferable to use epoxy compounds and oxetane compounds both having an oxirane structure in view of easiness in the synthesis and the better material property of the cured articles.

Now, representative examples for the component compounds according to the present invention are shown below. Provided, in the structures, X represent non-nucleophilic anion residue, such as $SbF_6$, $AsF_6$, $PF_6$, $BF_4$, and $(F_5C_5)_4B$. As shown in the examples, the component compounds of the present invention may be a polymer.

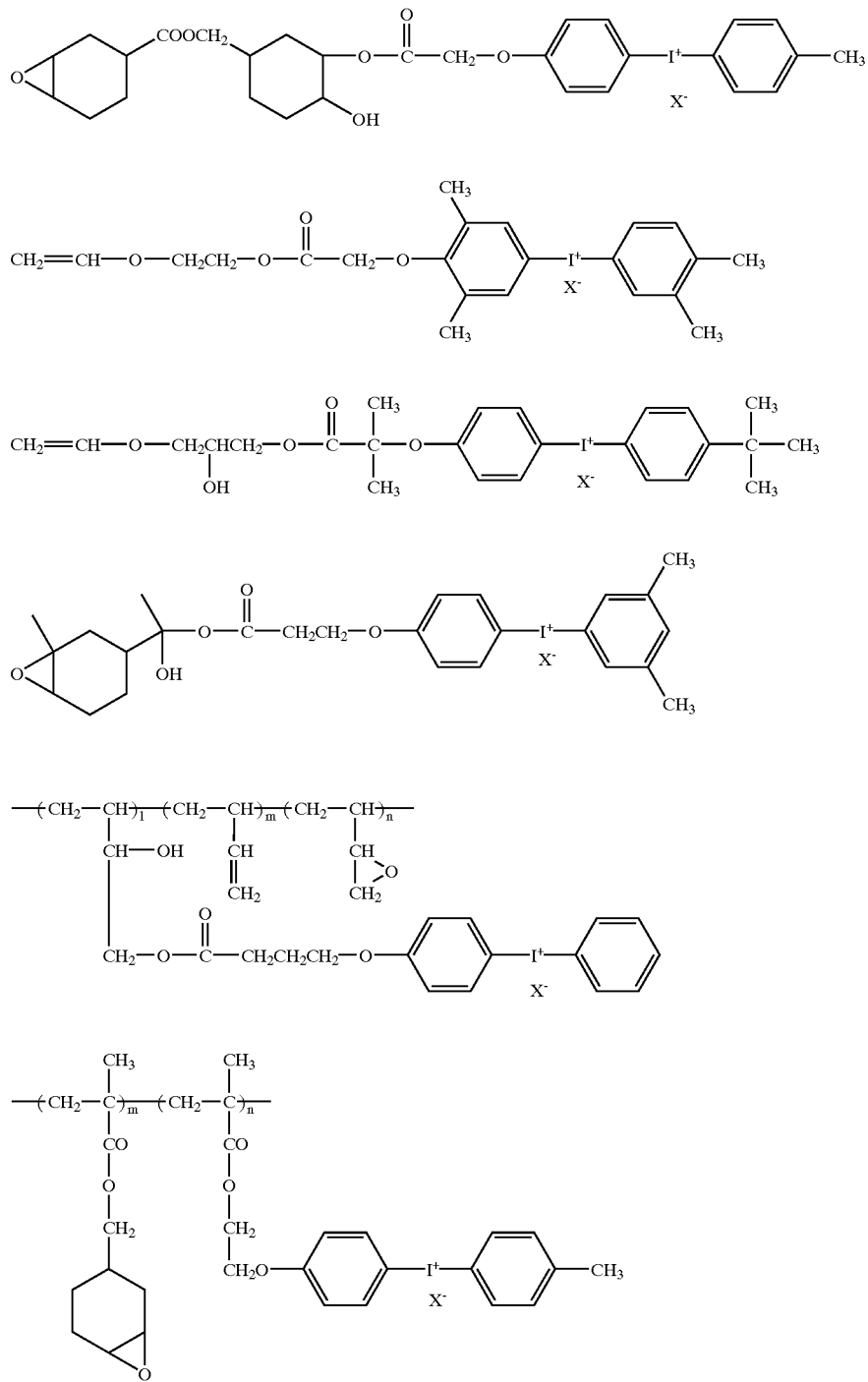

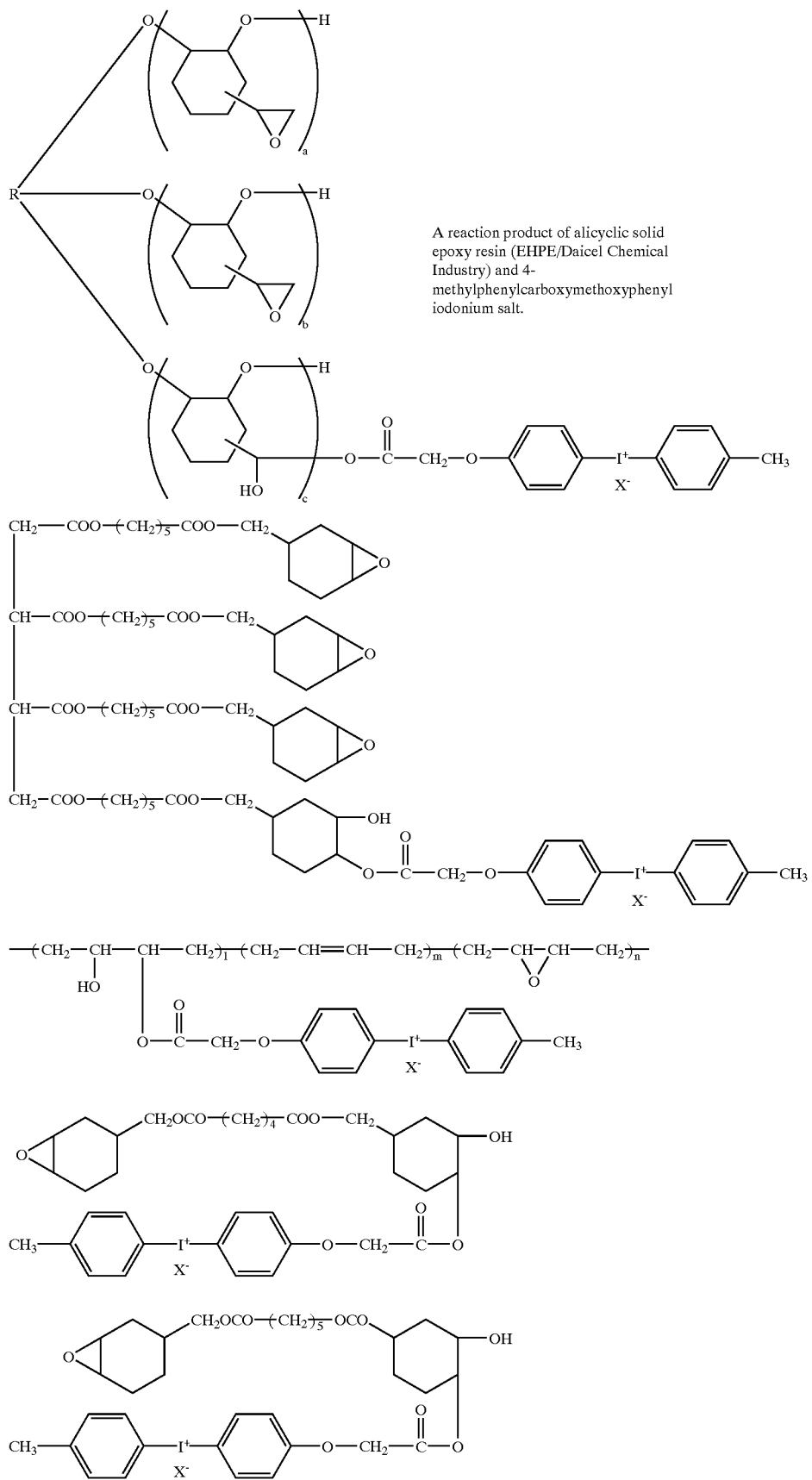
A reaction product of alicyclic solid epoxy resin (EHPE/Daicel Chemical Industry) and 4-methylphenylcarboxymethoxyphenyl iodonium salt.

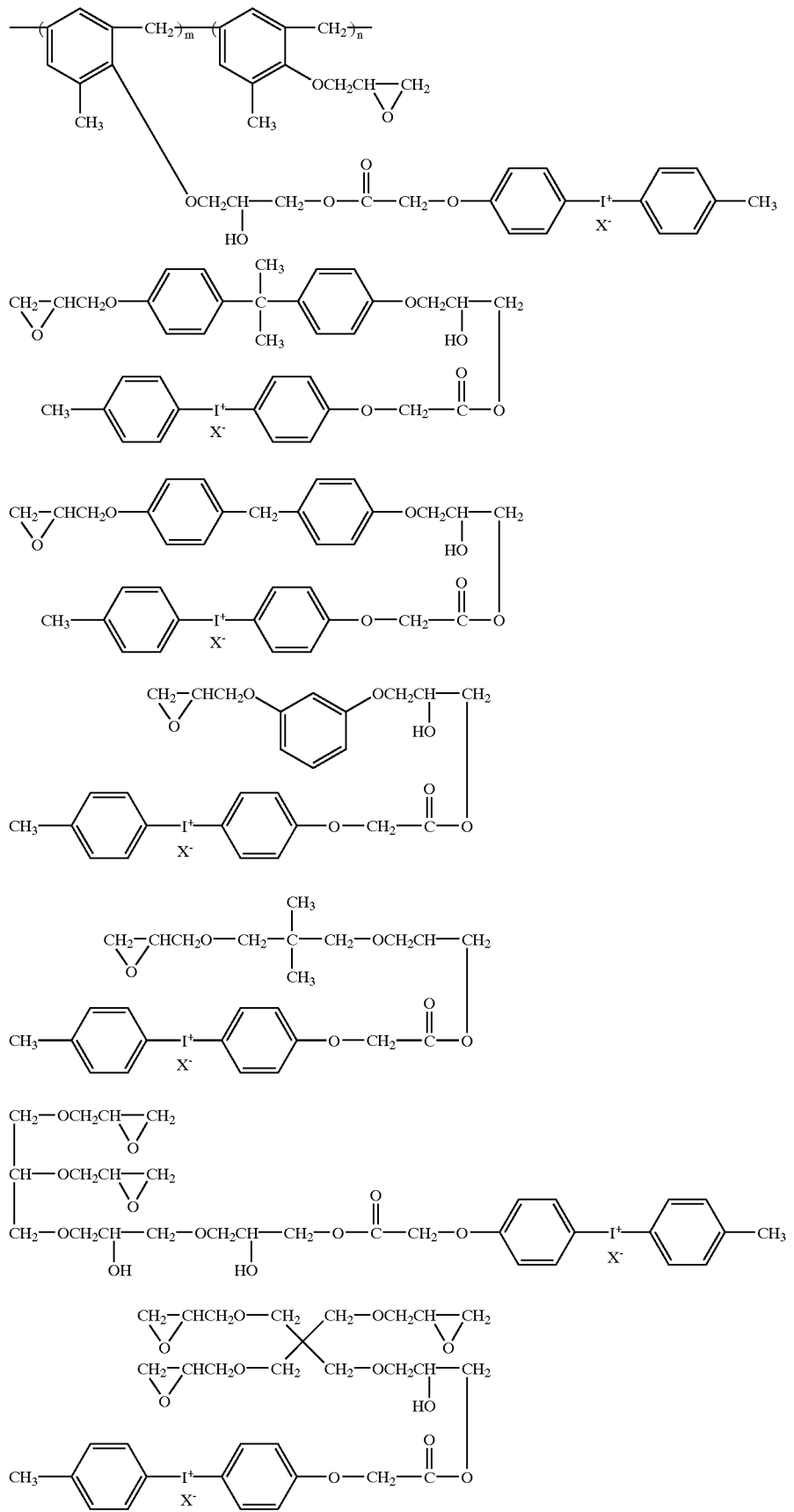

-continued
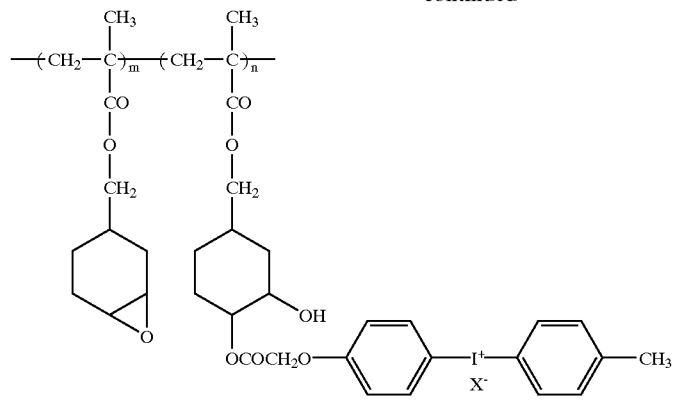
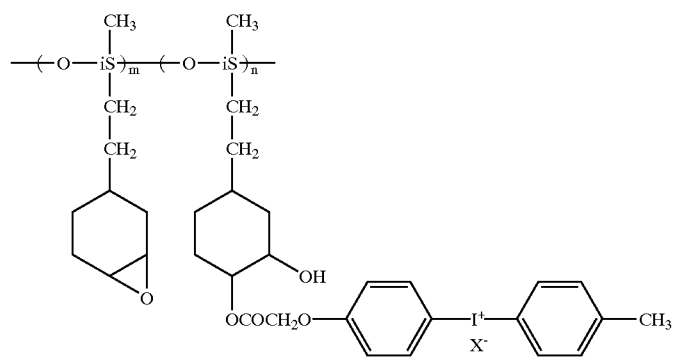
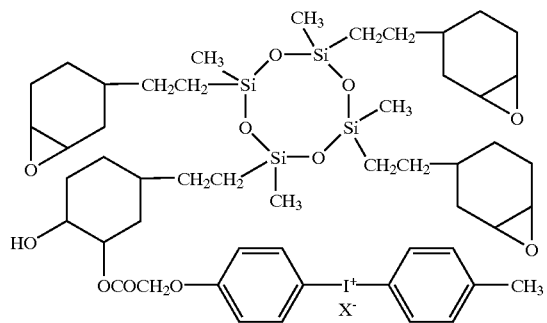
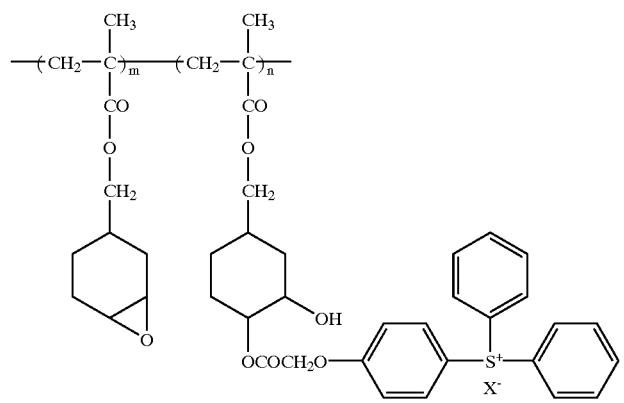

-continued
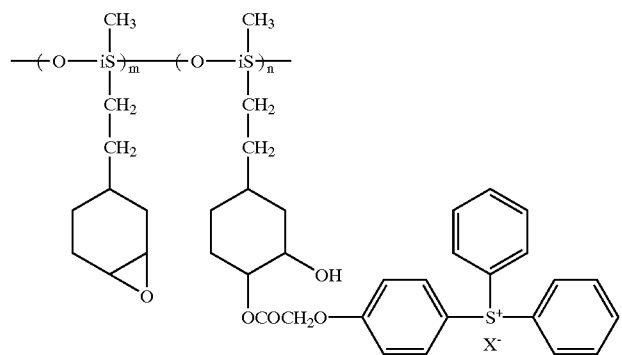
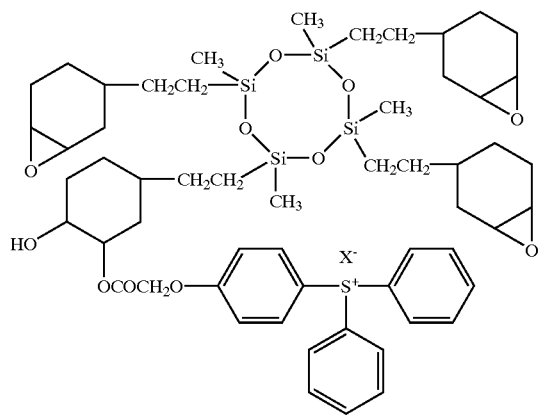
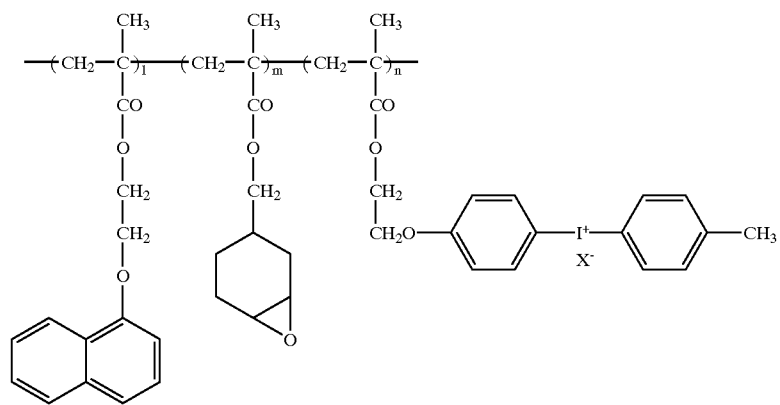
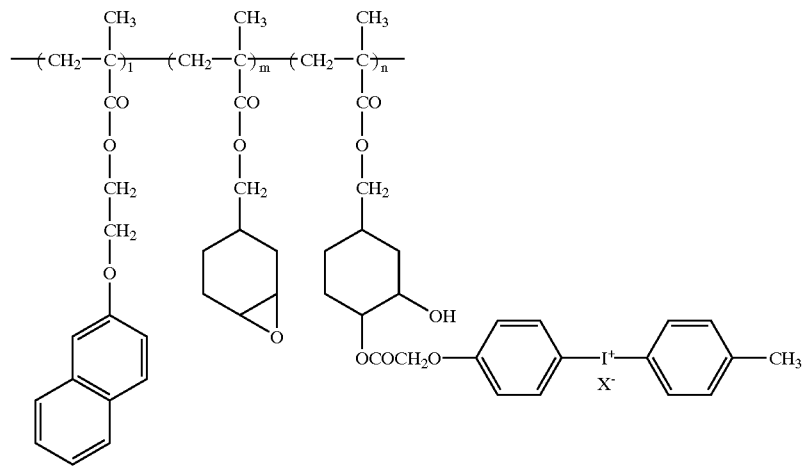

-continued
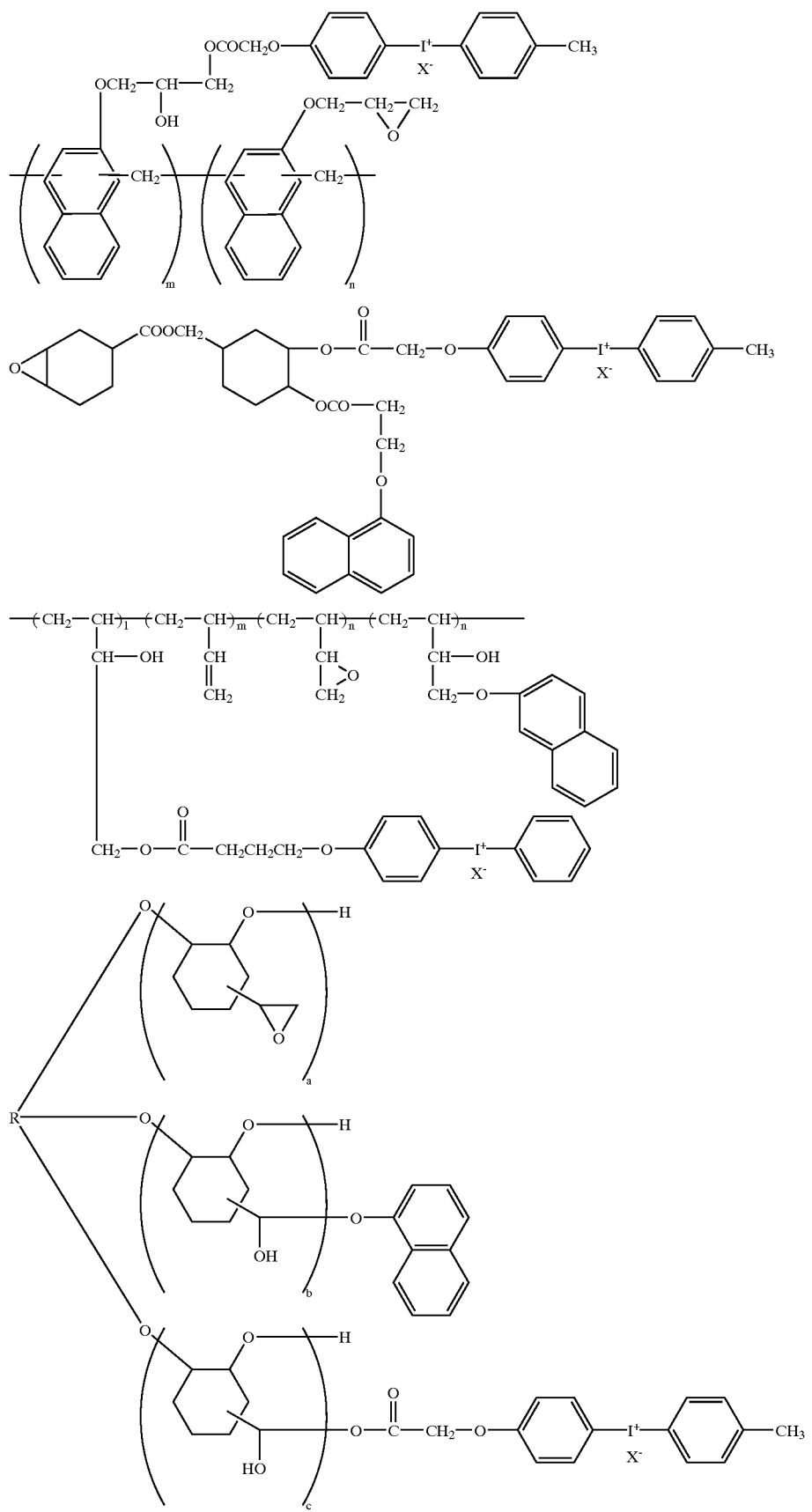

-continued
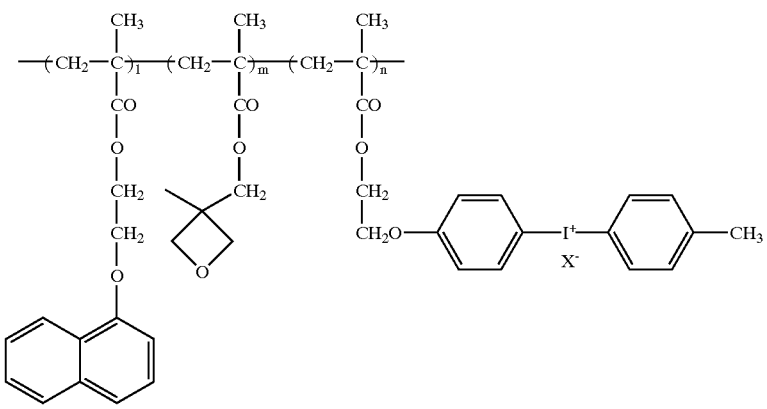
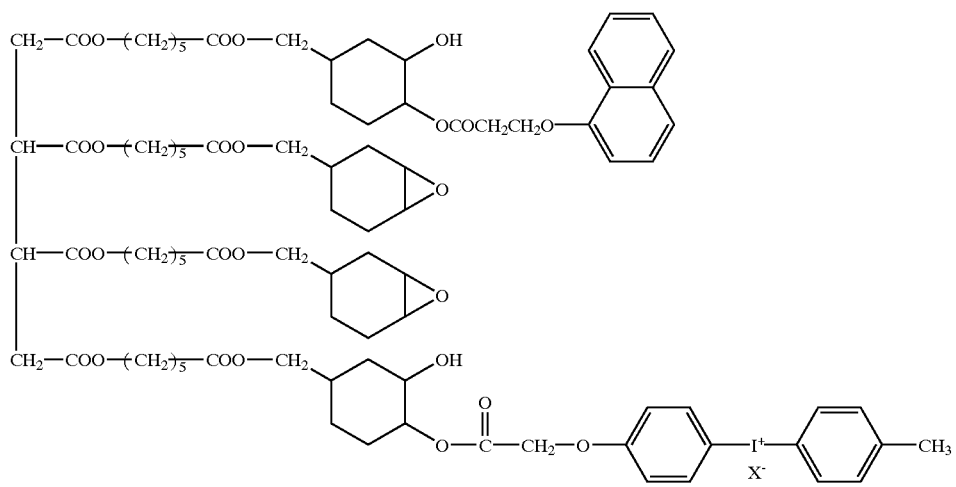
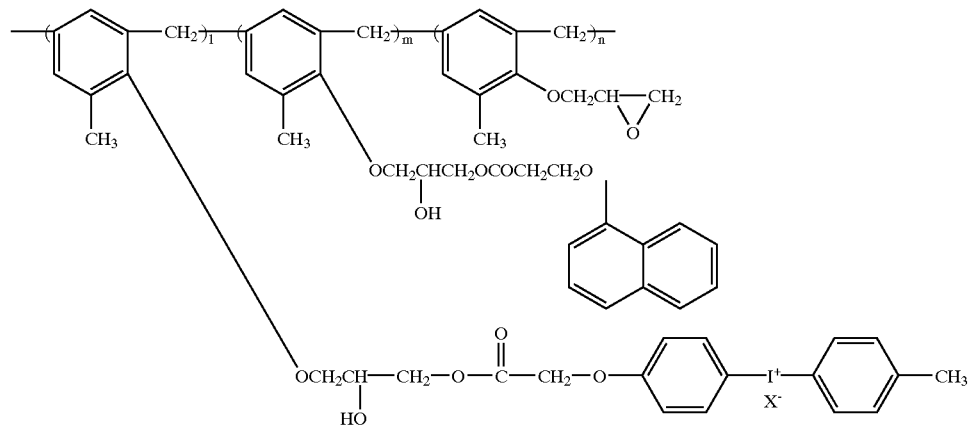
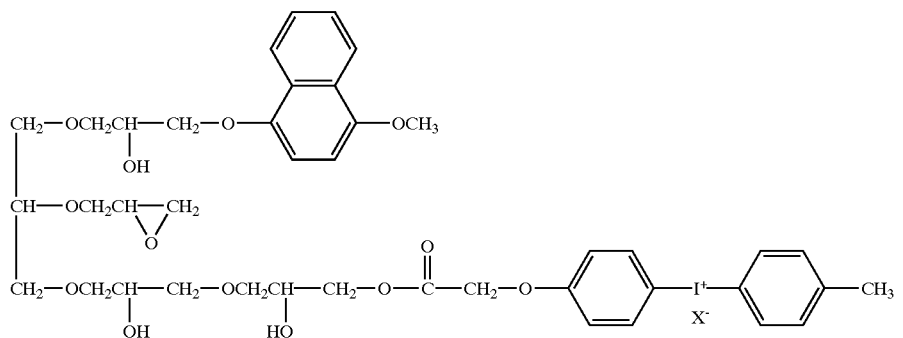

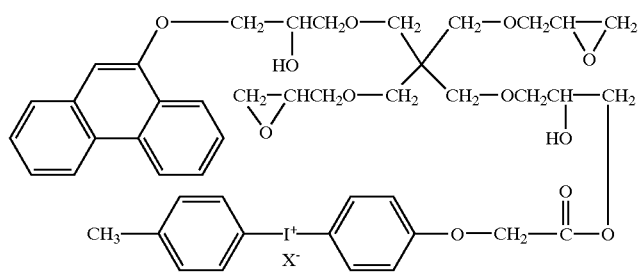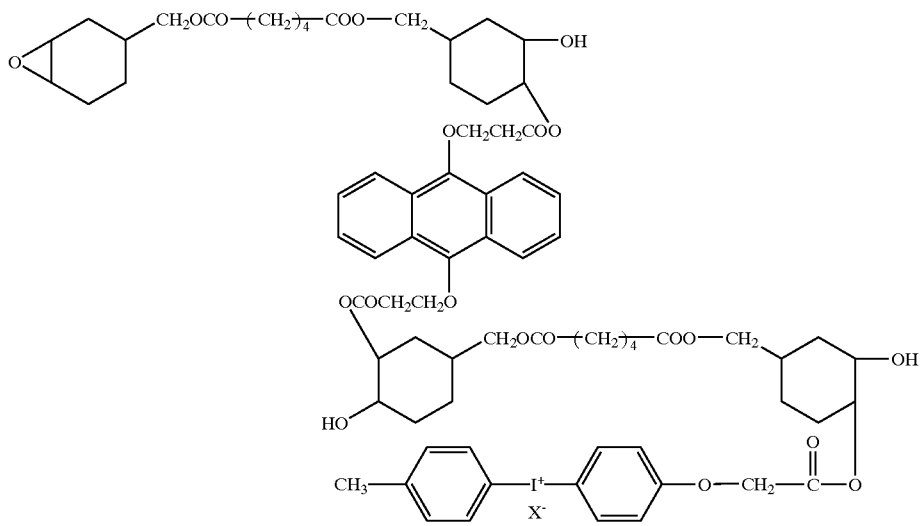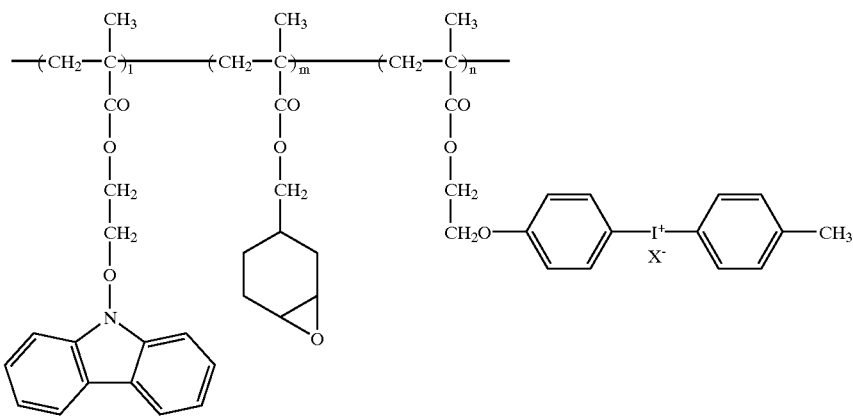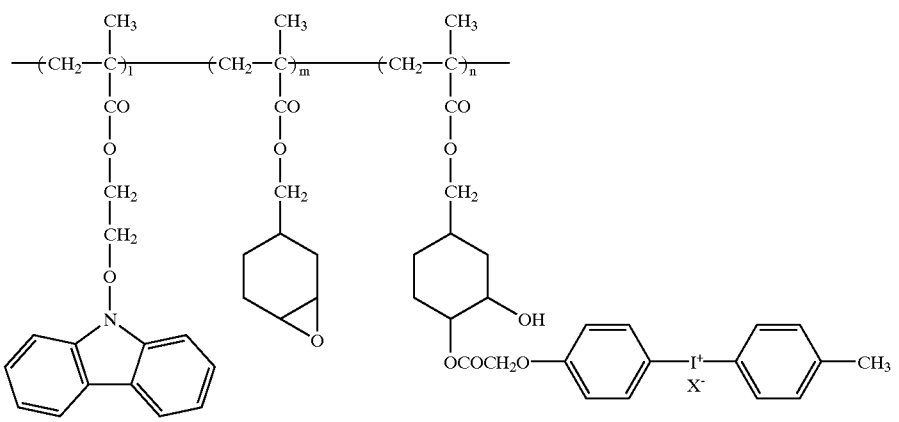

-continued
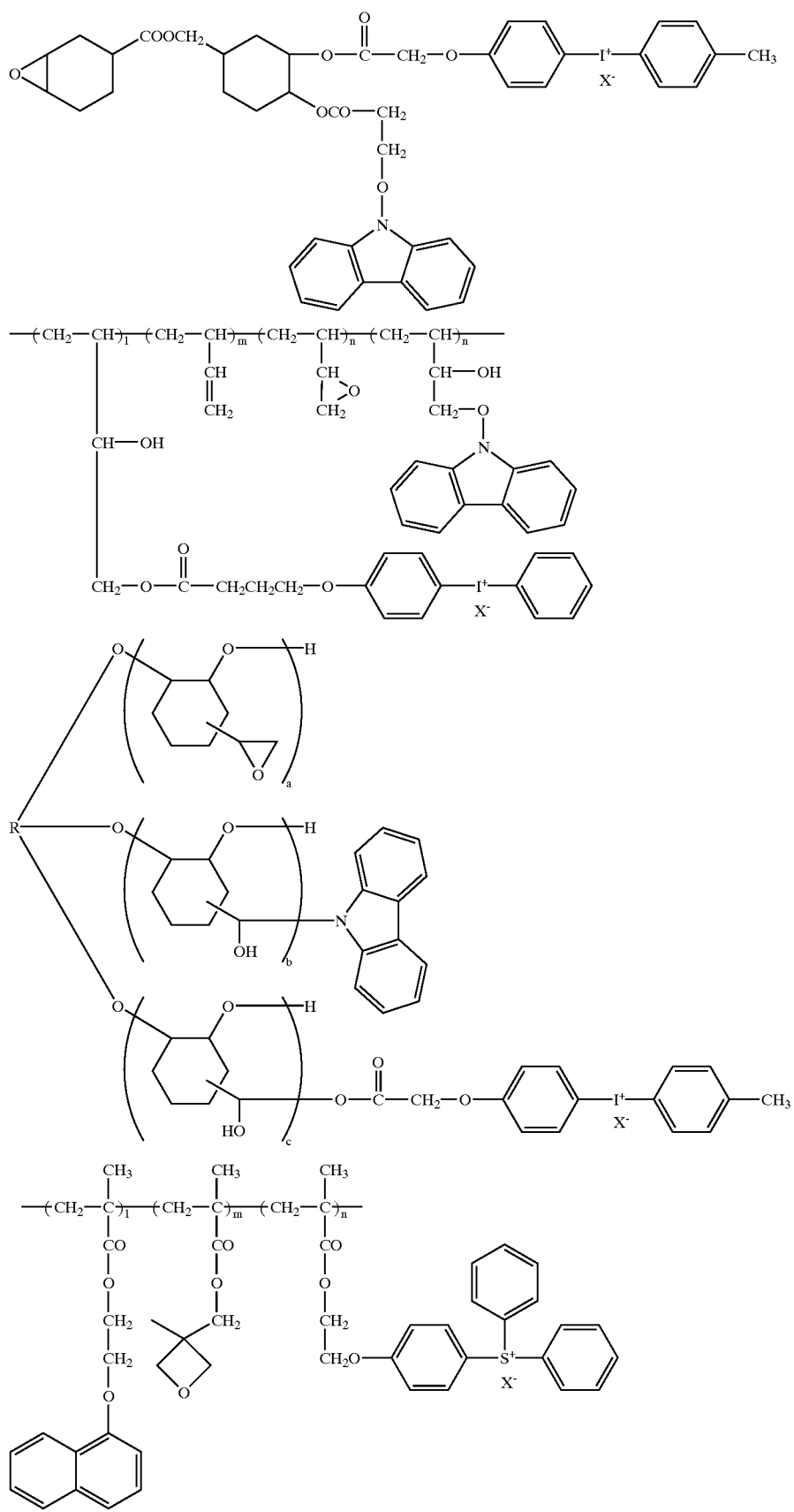

-continued
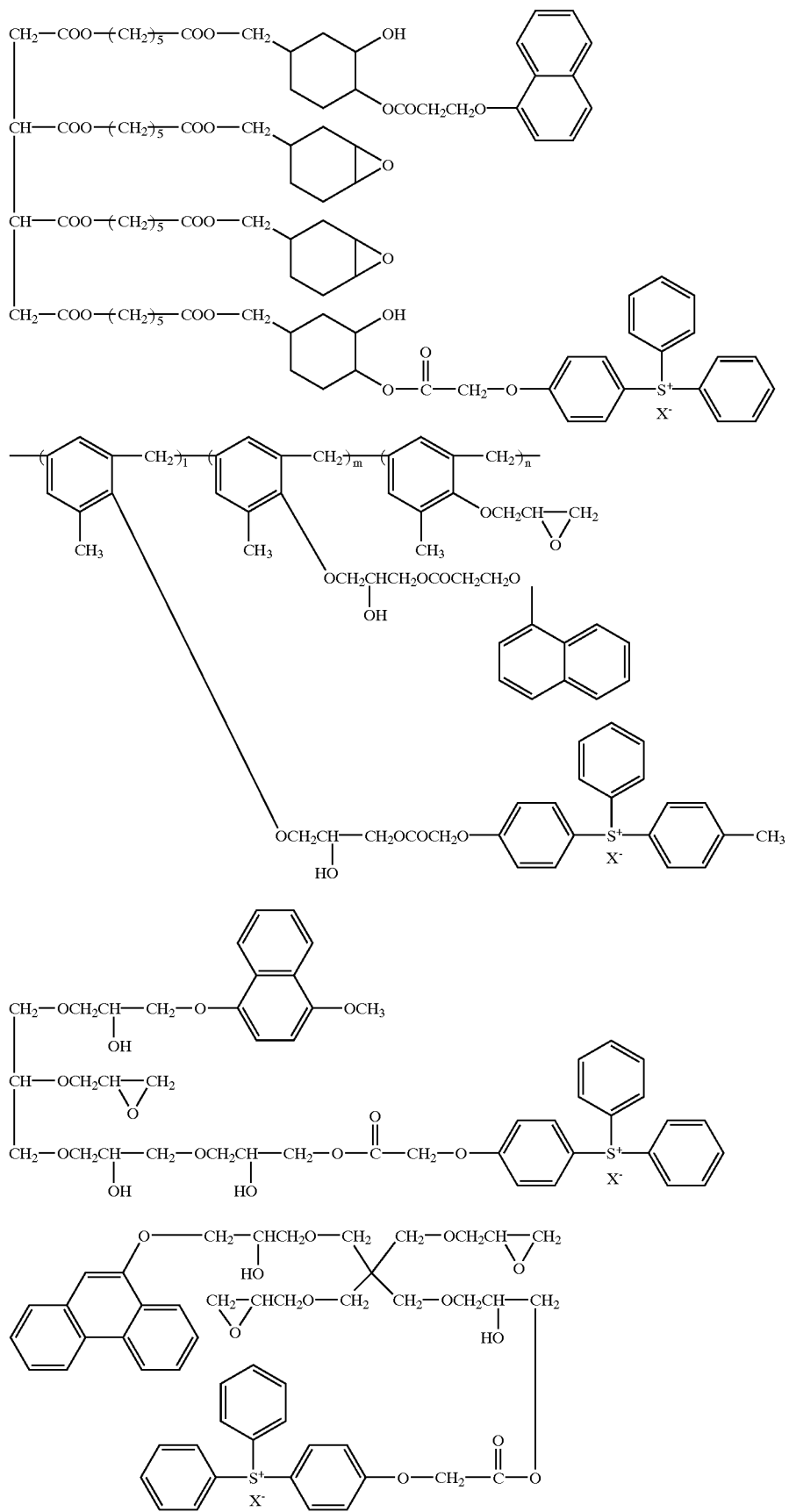

-continued

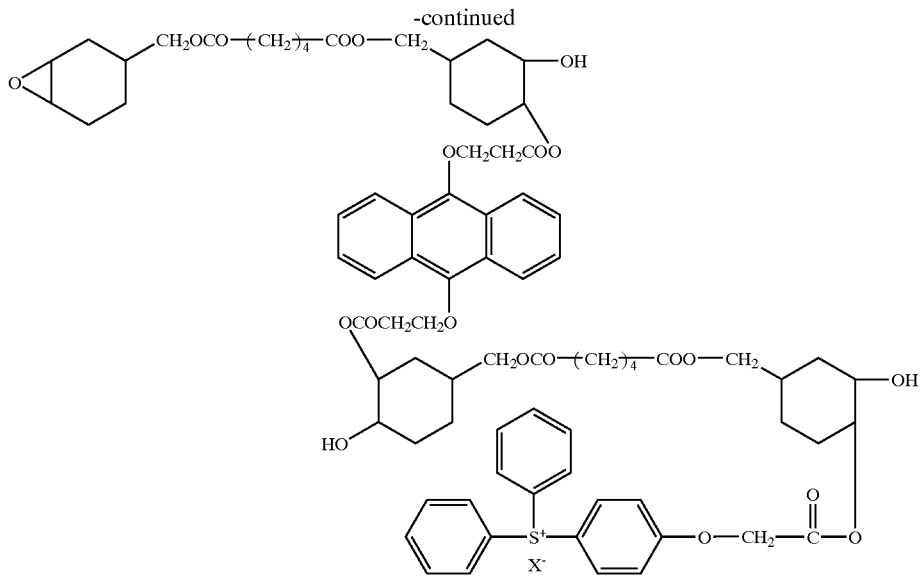

As the process to synthesize the component compound of the present invention,
- a process to synthesize the component compound by subjecting a substrate compound, a compound containing a group functioning as a cationic photopolymerization initiator, a compound having a cationically polymerizable group and a compound having a sensitizing group accelerating the photoinitiated cationic reaction to a reaction,
- a process to synthesize the component compound by subjecting a compound functioning as a cationic photopolymerization initiator, a compound having a cationically polymerizable group and a compound having a sensitizing group accelerating the photoinitiated cationic reaction to a reaction,
- a process to synthesize the component compound by subjecting a substrate compound, a compound containing a group functioning as a cationic photopolymerization initiator and a compound having a cationically polymerizable group to a reaction,
- a process to synthesize the component compound by subjecting a compound having a cationically polymerizable group and a compound containing a group functioning as a cationic photopolymerization initiator to a reaction, can be given as the examples. However, there is an advantage to employ;
- a process to synthesize the component compound of the present invention by subjecting to a reaction a cationic photopolymerization initiator having carboxyl group as a functional group, a sensitizer accelerating the photo-initiated cationic reaction having carboxyl, aromatic hydroxy and the like as a functioning group and either an epoxy-containing compound, such as epoxy silicon, or an oxetane-containing compound, those which allow at least one epoxy or oxetane group to remain even after the reaction with the cationic photopolymerization initiator and the sensitizer accelerating the photoinitiated cationic reaction,
- or a process to synthesize an onium salt compound by subjecting to a reaction a cationic photopolymerization initiator having carboxyl group and an epoxy-containing compound which allows to at least one oxirane group to remain even after the reaction with the cationic photopolymerization initiator, in view of easiness in the synthesis and of capability for controlling each groups.

As the cationically polymerizable compound used in the present invention, any monomers, oligomers and polymers having commonly-known cationically polymerizable groups can be used without limitation, and the ones as having been described above can be given as the examples.

The cationically polymerizable compounds described above can be used either solely or in combination of 2 or more thereof. Among such cationically polymerizable compounds, it is preferable to use one or more compounds selected from a group consisting of alicyclic epoxy compounds, vinyl ether compounds and oxetane compounds. Further, by using the component compound of the present invention as a cationic photopolymerization initiator, it makes possible to provide good compatibility with epoxy silicon, which is unable to expect with the known cationic photopolymerization initiator in the past. Thus, as the cationically polymerizable compound when the component compound of the present invention, such as the onium salt compound, is used as a cationic photopolymerization initiator, it is particularly preferable to use epoxy silicon.

As the sensitizer used in the present invention, any compounds, which can accelerate the photoreaction of the component compound of the present invention, such as the onium salt compound, can be used. When the onium salt compound is iodonium salt compound or the like, known sensitizers as described above can be given as the examples.

The photocurable composition according to the present invention can easily cure in the presence of light. As the light source, low-pressure mercury lamp, medium-pressure mercury lamp, high-pressure mercury lamp, super-high pressure mercury lamp, metal halide lamp, xenon lamp, carbon arc lamp and the like are used. Also, laser, such as semiconductor laser, Argon laser and He—Cd laser, can be used, however, it is preferable to use a lamp effectively irradiating light in a range of from 380 to 450 nm, in which range no absorbance by titanium dioxide occurs when photocurable composition containing titanium dioxide is used as a white pigment, particularly Gallium-containing lamp, since it allows to effectively cause photocuing and improve the curing speed and the material property of the cured articles, and curability of thick films. In addition, the photocurable composition according to the present invention can easily cure under irradiation of ionizing radiation, such as α-rays, β-rays, γ-rays, neutron beam, X-rays and accelerated electron rays.

By means of containing a pigment into the photocurable composition according to the present invention, the photocurable composition can be used for inks and photoresists. As the pigment to be used in the present invention, the ones as already described above are given.

The material properties of the cured articles, photocurability, etc. of the photocurable composition according to the present invention can be controlled by the use of a radically polymerizable compound. As the radically polymerizable compound to be used in the present invention, any monomers, oligomers and polymers having a radically polymerizable property can be used irrespective of the types, and it is particularly preferable to use unsaturated ester type compounds. As examples for the radically polymerizable monomers, monofunctional and multifunctional acrylate monomer and metacrylate monomer can be given. As examples for the radically polymerizable oligomers, epoxy acrylate, epoxy metacrylate, polyester acrylate, polyester metacrylate, polyether acrylate, polyether metacrylate, polyurethane acrylate, polyurethane metacrylate, polybutadiene acrylate and polybutadiene metacrylate can be given. As examples for the radically polymerizable polymers, acrylates, metacrylates and unsaturated polyesters, such as polyester, polybutadiene, polyether, urethane and epoxy, can be given.

As examples for radically polymerizable reactive diluent, acrylic acid ester monomer, such as acrylic acid and ethyl acrylate, metacrylic acid ester monomer, such as metacrylic acid and methylmetacrylate, styrene and the like can be given.

In the present invention, the contained ratio in the component compound of the present invention for the group functioning as a cationic photopolymerization initiator, the sensitizing group accelerating the photoinitiated cationic reaction and the cationically polymerizable group in the molecule may be optionally selected, however, the contained ratio by weight for the cationically polymerizable group, the group functioning as a cationic photopolymerization initiator and the sensitizing group accelerating the photoinitiated cationic reaction may be an optionally variable and are each independently in a range from 100:0.05:0.05 to 100:20:20, and preferably in a range from 100:0.2:0.1 to 100:10:10. Provided, when a cationically polymerizable compound is further added into the component compound of the present invention, the contained ratio by weight for the cationically polymerizable group in total, the group contained in the molecule of the component compound and functioning as a cationic photopolymerization initiator and the sensitizing group accelerating the photoinitiated cationic reaction are in a range from 100:0.05:0.05 to 100:20:20, respectively, and preferably in a range from 100:0.2:0.1 to 100:10:10. When the comparative amount of the group functioning as a cationic photopolymerization initiator and that of the group accelerating the photoinitiated cationic reaction are less than the amount of the cationically polymerizable group in total, photocurability of the onium salt compound and the combination thereof deteriorates, while the material properties of the cured articles deteriorates when the said comparative amount are excessive to the total amount of the cationically polymerizable group.

In the present invention, the contained ratio in the component compound for the group functioning as a cationic photopolymerization initiator and the cationically polymerizable group may be optionally selected, however, the ratio by weight shall be in a range from 100:0.05 to 100:20, and preferably in a range from 100:0.2 to 100:10. Provided, when a cationically polymerizable compound is further added into the component compound, the contained ratio by weight of the group functioning as a cationic photopolymerization initiator relative to the cationically polymerizable compound in total shall be in a range of 100:0.05 to 100:20, and preferably in a range from 100:0.2 to 100:10. Therefore, in this case, the ratio by weight of the group functioning as a cationic photopolymerization initiator relative to the cumulative weight of the cationically polymerizable group and the group functioning as a cationic photopolymerization initiator may be more than a ratio of 100:20. Whereas, when comparative amount of the group functioning as a cationic photopolymerization initiator to the whole is less, the photocurable property of the onium salt compound and the material properties of the cured article deteriorate, while those of the cured article deteriorate when the comparative amount of the group functioning as a cationic photopolymerization initiator to the whole is excessive.

The component compound of the present invention, the photocurable composition containing the component compound and particularly the photocurable composition containing a pigment may be further advantageously curable by an addition of a sensitizer. The combining rate for the sensitizer is in a range of from 0.001 to 10% by weight relative to the weight of the group part functioning as a cationic photopolymerization initiator in the component compound, and preferably in a range of from 0.01 to 5% by weight. When the rate for the sensitizer is less, the photocurable property of the component compound or the combined composition deteriorates, while the material properties of the composition deteriorates when the rate is excessive. Provided, a sensitizer having a cationically polymerizable group, such as epoxy and vinyl ether, does not cause such deterioration and is arbitrarily combined at any rate.

The photocurable composition according to the present invention is cured upon irradiation with actinic energy rays, such as light, electron rays and X-rays, and particularly, curable property of the photocurable composition combined with a pigment is further improved by means of combination of a sensitizer, comparing to the curable property of the photocurable composition with no addition of a sensitizer.

BEST MODE FOR CARRYING OUT THE INVENTION

Now, the present invention is further explained in detail, however, it should be noted that the present invention should not be limited to the description in the following examples.

EXAMPLE 1

Synthesis of 1,1'-Diphenyl-1,1'-(4,4'-oxydiphenyl) diiodonium bis-Hexafluorophosphate (Compound 1)

A mixture of diphenyl ether in an amount of 12.8 g, iodosobenzene acetate in an amount of 48.3 g, acetic acid in an amount of 380 g and acetic anhydride in an amount of 35 g was stirred at room temperature. After dissolving iodosobenzene acetate, sulfuric acid in an amount of 14.7 g was fed dropwise into the mixture at 25° C., and the mixture was further stirred for 3 hours at room temperature. After leaving the mixture overnight, 300 g pure water solution containing potassium hexafluorophosphate in an amount of 27.6 g was fed dropwise into the mixture under cooling with ice while giving stirring. The reacted crude solution was added with 1 L water, and the precipitated product obtained was filtrated, washed and dried under reduced pressure at 40° C. to obtain white powder in an amount of 39.2 g.

In the following, Compound 2, Compound 4, Compound 7, Compound 8 and Compound 12 were synthesized according to the process as described in this Example 1.

EXAMPLE 2

Synthesis of 2-[2-(4-Ethoxycarbonylmethoxyphenyl)-2-propyl] phenylphenyliodoniumhexafluorophosphate (Compound 11)

4-Ethyl cumylphenoxy acetate in an amount of 11.4 g, iodosobenzene acetate in an amount of 12.2 g, acetic acid in an amount of 190 g, and acetic anhydride in an amount of 17.6 g were mixed and stirred at room temperature. After dissolving iodosobenzene acetate, sulfuric acid in an amount of 3.7 g was fed dropwise into the mixture at 15° C. and stirred for 3 hours at room temperature. After leaving the mixture overnight, 38 ml aqueous solution of sodium bromide in an amount of 7.8 g was fed dropwise into the mixture under cooling with ice while giving stirring. The reacted crude solution was added with 1 L water and washed with hexane in an amount of 70 g. The solution was then fed dropwise with 100 g pure water solution containing potassium hexafluorophosphate in an amount of 7.0 g under stirring. The solution was then extracted with ethyl acetate in an amount of 400 g, and the extract obtained was washed with aqueous solution of sodium carbonate and then water, dehydrated with anhydrous magnesium sulfate, condensed, and dried at 40° C. under reduced pressure to obtain a viscous product in an amount of 15.6 g.

Similarly, according to the process as described above, Compound 9, Compound 10, Compounds 13 through 16, Compounds 18 and 19, Compounds 24 and 25, Compounds 28 and 29, Compound 31 and Compound 34 were synthesized.

EXAMPLE 3

Synthesis of 4.4'-bis(Acetoxymethyl) phenyliodoniumhexafluoro Phosphate (Compound 20)

Acetoxymethylbenzene in an amount of 13.8 g, potassium iodate in an amount of 10.0 g and acetic anhydride in an amount of 60 g were mixed and stirred at 15° C. To the mixture, a mixture solution of sulfuric acid in an amount of 12.9 g and acetic anhydride in an amount of 10.8 g was fed dropwise and the mixture was left overnight following to the drop. The mixture was then fed dropwise with water in an amount of 30 g under cooling with ice and was further added with hexane in an amount of 30 g. The precipitated white salt was removed, and the added hexane was subsequently removed by separation. The reacted crude solution was then poured into an aqueous solution of ammonium chloride (ammonium chloride 5.4 g/water 200 g). The solution was further added with ethyl acetate in an amount of 200 g to extract, and the obtained ethyl acetate extract was then added with 100 g pure water solution of potassium hexafluorophosphate in an amount of 8.7 g and the extract solution was subsequently stirred. The solution was washed, dehydrated, condensed and dried at 40° C. under reduced pressure to obtain a viscous product in an amount of 10.0 g.

Similarly, according to the process as described in this example, Compound 17, Compounds 21 through 23, Compounds 26 and 27, Compound 30, Compounds 32 and 33 were synthesized.

EXAMPLE 4

One part of each of the iodonium salt compounds and a sensitizer, if required, were combined with UVR-6110 (alicyclic epoxy compound manufactured by UCC), and maximum curing speed of the combined compositions were measured upon irradiation with light of a belt conveyer type high-pressure mercury lamp (80W). The results were shown in Table 1.

EXAMPLE 5

100 parts of UVR-6110 (alicyclic epoxy compound manufactured by UCC), 100 parts of titanium dioxide, 2 parts of the iodonium salt compound and 1 part of a sensitizer were mixed and kneaded by using 3 rollers. The maximum curing speed of each mixtures was determined upon irradiation with light of a belt conveyer type Gallium-containing metal halide lamp (160W).

TABLE 1

| | Clear System (Example 4) | | | Pigmented System (Example 5) | |
|---|---|---|---|---|---|
| | | Type & | | | |
| Iodonium salt | No Sensitizer | Ratio of Sensitizer | Curing Performance | Sensitizer (4) | Sensitizer (5) |
| Compound 1 | Curable at 20 m/min. | (1):0.5 Part | Curable at 80 m/min. | Curable at 40 m/min. | Curable at 60 m/min. |
| Compound 2 | Curable at 20 m/min. | (2):0.5 Part | Curable at 80 m/min. | Curable at 40 m/min. | Curable at 60 m/min. |
| Compound 4 | Curable at 20 m/min. | (3):0.5 Part | Curable at 80 m/min. | Curable at 40 m/min. | Curable at 60 m/min. |
| Compound 7 | Curable at 20 m/min. | (1):1.0 Part | Curable at 100 m/min. | Curable at 40 m/min. | Curable at 60 m/min. |

TABLE 1-continued

|  | Clear System (Example 4) | | | Pigmented System (Example 5) | |
|---|---|---|---|---|---|
| | | Type & | | | |
| Iodonium salt | No Sensitizer | Ratio of Sensitizer | Curing Performance | Sensitizer (4) | Sensitizer (5) |
| Compound 8 | Curable at 20 m/min. | (1):1.0 Part | Curable at 100 m/min. | Curable at 40 m/min. | Curable at 60 m/min. |
| Compound 9 | Curable at 5 m/min. | (1):0.5 Part | Curable at 40 m/min. | Curable at 20 m/min. | Curable at 40 m/min. |
| Compound 10 | Curable at 5 m/min. | (1):1.0 Part | Curable at 100 m/min. | Curable at 20 m/min. | Curable at 40 m/min. |
| Compound 11 | Curable at 5 m/min. | (2):1.0 Part | Curable at 100 m/min. | Curable at 20 m/min. | Curable at 40 m/min. |
| Compound 12 | Curable at 5 m/min. | (3):1.0 Part | Curable at 100 m/min. | Curable at 20 m/min. | Curable at 40 m/min. |
| Compound 13 | Curable at 5 m/min. | (1):0.5 Part | Curable at 40 m/min. | Curable at 20 m/min. | Curable at 40 m/min. |
| Compound 14 | Curable at 5 m/min. | (1):0.5 Part | Curable at 40 m/min. | Curable at 20 m/min. | Curable at 40 m/min. |
| Compound 15 | Curable at 5 m/min. | (1):0.5 Part | Curable at 40 m/min. | Curable at 20 m/min. | Curable at 40 m/min. |
| Compound 16 | Curable at 5 m/min. | (1):1.0 Part | Curable at 100 m/min. | Curable at 20 m/min. | Curable at 40 m/min. |
| Compound 17 | Curable at 5 m/min. | (2):1.0 Part | Curable at 100 m/min. | Curable at 20 m/min. | Curable at 40 m/min. |
| Compound 18 | Curable at 5 m/min. | (3):1.0 Part | Curable at 100 m/min. | Curable at 20 m/min. | Curable at 40 m/min. |
| Compound 19 | Curable at 5 m/min. | (1):0.5 Part | Curable at 40 m/min. | Curable at 20 m/min. | Curable at 40 m/min. |
| Compound 21 | Curable at 5 m/min. | (1):0.5 Part | Curable at 40 m/min. | Curable at 20 m/min. | Curable at 40 m/min. |
| Compound 22 | Curable at 5 m/min. | (2):1.0 Part | Curable at 100 m/min. | Curable at 20 m/min. | Curable at 40 m/min. |
| Compound 23 | Curable at 5 m/min. | (1):0.5 Part | Curable at 40 m/min. | Curable at 20 m/min. | Curable at 40 m/min. |
| Compound 24 | Curable at 5 m/min. | (1):1.0 Part | Curable at 100 m/min. | Curable at 20 m/min. | Curable at 40 m/min. |
| Compound 25 | Curable at 5 m/min. | (3):1.0 Part | Curable at 100 m/min. | Curable at 20 m/min. | Curable at 40 m/min. |
| Compound 26 | Curable at 5 m/min. | (1):0.5 Part | Curable at 40 m/min. | Curable at 20 m/min. | Curable at 40 m/min. |
| Compound 27 | Curable at 5 m/min. | (1):0.5 Part | Curable at 40 m/min. | Curable at 20 m/min. | Curable at 40 m/min. |
| Compound 28 | Curable at 5 m/min. | (1):0.5 Part | Curable at 40 m/min. | Curable at 20 m/min. | Curable at 40 m/min. |
| Compound 29 | Curable at 5 m/min. | (1):0.5 Part | Curable at 40 m/min. | Curable at 20 m/min. | Curable at 40 m/min. |
| Compound 30 | Curable at 5 m/min. | (1):0.5 Part | Curable at 40 m/min. | Curable at 20 m/min. | Curable at 40 m/min. |
| Compound 31 | Curable at 5 m/min. | (1):0.5 Part | Curable at 40 m/min. | Curable at 20 m/min. | Curable at 40 m/min. |
| Compound 32 | Curable at 5 m/min. | (1):0.5 Part | Curable at 40 m/min. | Curable at 20 m/min. | Curable at 40 m/min. |
| Compound 33 | Curable at 5 m/min. | (1):0.5 Part | Curable at 40 m/min. | Curable at 20 m/min. | Curable at 40 m/min. |
| Compound 34 | Curable at 5 m/min. | (1):0.5 Part | Curable at 40 m/min. | Curable at 20 m/min. | Curable at 40 m/min. |

Sensitizer:
(1)1-Naphthol,
(2)9,10-Dimethoxyphenanthrene,
(3)N-Ethylcarbazole,
(4)2,4-Dimethylthioxanthone,
(5)2-Ethyl-9,10-Dimethoxyanthracene

EXAMPLE 6

4-Carboxymethoxyphenylphenyliodoniumhexafluorophosphate in an amount of 1 g and tetrabutylammonium bromide in an amount of 0.01 g were dissolved in acetonitrile in an amount of 15 ml, and to the resulting solution, epoxy silicon (K-62-722, Manufactured by Shin-etsu Silicon) in an amount of 20 g was added. Then, the solution was subjected to a reaction at 75° C. for 6 hours. The reacted solution was then added with 100 ml hexane to precipitate un-reacted 4-carboxymethoxyphenylphenyliodoniumhexafluorophosphate. After filtrating the precipitate, the solution was condensed to obtain an onium salt compound with slightly milky appearance. IR spectrum ($cm^{-1}$) of the obtained onium salt compound is 2963, 1740, 1573, 1486, 1261, 1094, 1024, 802, 558.

EXAMPLE 7

The onium salt compound in an amount of 10 g, which was synthesized in Example 6 and was added with a sensitizer, 9,10-dimethoxyphenanthrene in an amount of 0.1 g, was coated onto a tin plate so as to make the thickness of the coated film to 3 μm, and the coated tin plate was then subjected to irradiation with light of a high-pressure mercury lamp (80W) at a speed of 30 m/min. As a result, a tack-free cured coating film was obtained. Although a trial to attach a cellophane tape onto the cured film, no adhesion therebetween was made, and no transfer of the cured film to the tape was observed.

EXAMPLE 8

A sensitizer, 9,10-dimethoxyphenanthrene in an amount of 0.1 g was added to a mixture of the onium salt compound in an amount of 5 g synthesized in Example 6 and cyclohexene oxide in an amount of 5 g, and the resulting mixture was coated onto a tin plate so as to make the thickness of the coated film to 3 μm, and the coated tin plate was then subjected to irradiation with light of a high-pressure mercury lamp (80W) at a speed of 30 m/min. As a result, a tack-free cured coating film was obtained. Although a trial to attach a cellophane tape onto the cured film, no adhesion therebetween was made, and no transfer of the cured film to the tape was observed.

EXAMPLE 9

To 100 ml dimethylsulfoxide, were dissolved naphthol novolak epoxy resin, ESN-175 (Manufactured by Shin-nittetsu Kagaku) in an amount of 50 g, tetrabutylammonium bromide in an amount of 0.5 g and 4-carboxymethoxy-phenylphenyliodoniumhexafluorophosphate in an amount of 10 g, and the solution was subjected to a reaction at 80° C. for 5 hours. The reacted solution was then poured into 1 L water, and 200 ml ethyl acetate was added to the solution to extract, and the obtained extract was then washed and filtrated. The ethyl acetate solution was added with anhydrous magnesium sulfate, dehydrated and condensed to obtain an objective substance in an amount of 55.4 g.

EXAMPLE 10

3-(2-Naphthoxy)butyric acid in an amount of 5.4 g and tetrabutylammonium bromide in an amount of 0.3 g were dissolved in 100 ml dimethylsulfoxide, and alicyclic epoxy GT-400 in an amount of 20 g manufactured by Daicel Chemical was added to the solution and was subjected to a reaction at 100° C. for 8 hours. Then, 4-carboxymethoxy-phenylphenyliodoniumhexafluorophosphate in an amount of 10 g was added to the reacted solution, and the solution was further subjected to a reaction at 80° C. for 5 hours. The reacted solution was then poured into 1 L water, and 200 ml ethyl acetate was added to the solution to extract, and the obtained extract was then washed and filtrated. The ethyl acetate solution was added with anhydrous magnesium sulfate, dehydrated and condensed to obtain an objective substance in an amount of 30.3 g.

EXAMPLE 11

A mixture of the onium salt compound in an amount of 10 g synthesized in Example 9 and alicyclic epoxy UVR-6110 in an amount of 90 g (Manufactured by UCC) was coated onto a tin plate so as to make the thickness of the coated film to 3 μm, and the coated tin plate was then subjected to irradiation with light of a high-pressure mercury lamp (120W) at a speed of 50 m/min. As a result, a tack-free cured coating film was obtained.

EXAMPLE 12

Except replacing the onium salt compound synthesized in Example 9 by the onium salt compound synthesized in Example 2, the same procedure described in Example 3 was applied to the mixture. As a result, a tack-free cured coating film was obtained.

EXAMPLE 13

A mixture of the onium salt compound in an amount of 5 g synthesized in Example 10 and cyclohexene oxide in an amount of 5 g was coated onto a tin plate so as to make the thickness of the coated film to 3 μm, and the coated tin plate was then subjected to irradiation with light of a high-pressure mercury lamp (120W) at a speed of 50 m/min. As a result, a tack-free cured coating film was obtained.

Industrial Use of the Invention

The iodonium salt compound according to the present invention is colorless substance and can be easily synthesized in high yield, and particularly by means of combing use with a sensitizer, it can give excellent photoreactivity with both clear system and pigmented system, and it cures a cationically polymerizable compound in a short time upon irradiation with actinic energy rays, such as light, electron rays and X-rays. In addition, the cured articles of the photocurable composition of the present invention have the excellent material properties and they can be preferably used for coating materials, adhesives, photoresists, inks, silicon release, etc.

What is claimed is:

1. A photocurable composition comprising at least one of the iodonium salt compounds represented by a general formula (I):

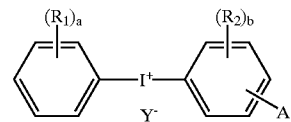

wherein $R_1$ and $R_2$ represent each independently hydrogen, optionally-substituted alkyl, optionally-substituted cycloalkyl, optionally-substituted alkoxy, or carboxyl or its ester, a and b represent each independently an integer selected from 1 to 4, provided, when a and/or b is 2 or more, respectively, the corresponding 2 or more substituents, $R_1$ and/or $R_2$, may be the same or different group, respectively, Y represents non-nucleophilic anion residue, A represents any one group selected from a group consisting of substituents represented by the following chemical formulas,

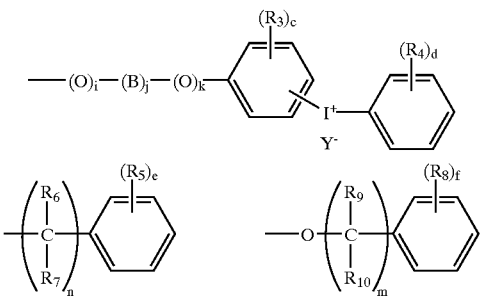

-continued

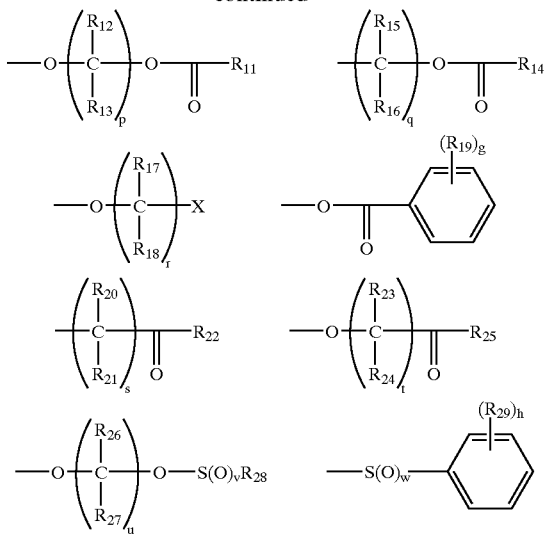

B represents optionally-substituted alkylene or optionally-substituted phenylene, i, j and k represent each independently 0 or 1, provided, i, j and k never be 0 at the same time and there is no case for i=1, j=0 and k=1, simultaneusly, $R_3$, $R_4$, $R_5$, $R_8$, $R_{19}$ and $R_{29}$ represent each independently hydrogen, halogen, optionally-substituted alkyl, optionally-substituted cycloalkyl, optionally-substituted phenyl, optionally-substituted alkoxy, optionally-substituted cycloalkoxy, optionally-substituted phenoxy, or carboxyl or its ester, $R_6$, $R_7$, $R_9$, $R_{10}$, $R_{12}$, $R_{13}$, $R_{15}$, $R_{16}$, $R_{17}$, $R_{18}$, $R_{20}$, $R_{21}$, $R_{23}$, $R_{24}$, $R_{26}$, and $R_{27}$ represent independently hydrogen, optionally-substituted alkyl, optionally-substituted cycloalkyl or optionally-substituted phenyl, c, d, e, f, g and h represent each independently an integer selected from 1 to 5, provided, when c, d, e, f, g and/or h represent 2 or more, respectively, the corresponding 2 or more substituents, $R_3$, $R_4$, $R_5$, $R_8$, $R_{19}$ and/or $R_{29}$, may be the same or different group, respectively, n, m, p, q, r, s, t and u represent each independently an integer selected from 1 to 8, provided, when n, m, p, q, r, s, t and/or u is 2 or more, respectively, the corresponding 2 or more substituents, $R_6$, $R_7$, $R_9$, $R_{10}$, $R_{12}$, $R_{13}$, $R_{15}$, $R_{16}$, $R_{17}$, $R_{18}$, $R_{20}$, $R_{21}$, $R_{24}$, $R_{26}$ and $R_{27}$, may be the same or different group, $R_{11}$, $R_{14}$, $R_{25}$ and $R_{28}$ represent each independently hydrogen, optionally-substituted alkyl, optionally-substituted cycloalkyl or optionally-substituted phenyl, $R_{22}$ represents hydrogen, optionally-substituted alkyl, optionally-substituted cycloalkyl, optionally-substituted phenyl or optionally-substituted alkoxy, v and w represent each independently an integer of 0, 1 or 2, and X represents halogeno, a cationically polymerizable compound, and a sensitizer.

2. The photocurable composition according to claim 1, wherein the sensitizer is one or two compounds selected from a group consisting of 9,10-dialkoxyanthrecene derivatives, phenenthrene derivatives, thioxanthone derivatives, carbazole derivatives and naphthalene derivatives.

3. The photocurable composition according to claim 2, characterized in that the photocurable composition further comprises a pigment.

4. The photocurable composition according to claim 3, characterized in that the photocurable composition further comprises a radically polymerizable compound.

5. The photocurable composition according to claim 2, characterized in that the photocurable composition further comprises a radically polymerizable compound.

6. The photocurable composition according to claim 1, characterized in that the photocurable composition further comprises a pigment.

7. The photocurable composition according to claim 6, characterized in that the photocurable composition further comprises a radically polymerizable compound.

8. The photocurable composition according to claim 1, characterized in that the photocurable composition further comprises a radically polymerizable compound.

9. A photocurable composition comprising at least one of the iodonium salt compounds represented by a general formula (I):

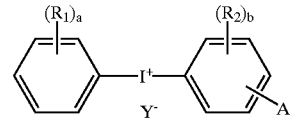

wherein $R_1$ and $R_2$ represent each independently hydrogen, optionally-substituted alkyl, optionally-substituted cycloalkyl, optionally-substituted alkoxy, or carboxyl or its ester, a and b represent each independently an integer selected from 1 to 4, provided, when a and/or b is 2 or more, respectively, the corresponding 2 or more substituents, $R_1$ and/or $R_2$, may be the same or different group, respectively, Y represents non-nucleophilic anion residue, A represents any one group selected from a group consisting of substituents represented by the following chemical formulas,

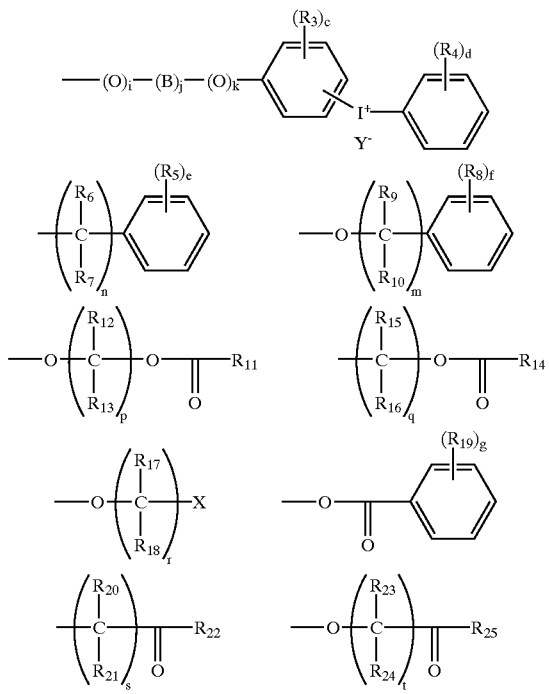

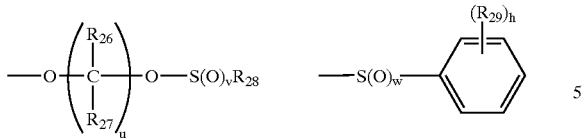

B represents optionally-substituted alkylene or optionally-substituted phenylene, i, j and k represent each independently 0 or 1, provided, i, j and k never be 0 at the same time and there is no case for i=1, j=0 and k=1, simultaneously, $R_3$, $R_4$, $R_5$, $R_8$, $R_{19}$ and $R_{29}$ represent each independently hydrogen, halogeno, optionally-substituted alkyl, optionally-substituted cycloalkyl, optionally-substituted phenyl, optionally-substituted alkoxy, optionally-substituted cycloalkoxy, optionally-substituted phenoxy, or carboxyl or its ester, $R_6$, $R_7$, $R_9$, $R_{10}$, $R_{12}$, $R_{13}$, $R_{15}$, $R_{16}$, $R_{17}$, $R_{18}$, $R_{20}$, $R_{21}$, $R_{23}$, $R_{24}$, $R_{26}$, and $R_{27}$ represent each independently hydrogen, optionally-substituted alkyl, optionally-substituted cycloalkyl or optionally-substituted phenyl, c, d, e, f, g and h represent each independently an integer selected from 1 to 5, provided, when c, d, e, f, g and/or h represent 2 or more, respectively, the corresponding 2 or more substituents, $R_3$, $R_4$, $R_5$, $R_8$, $R_{19}$ and/or $R_{29}$, may be the same or different group, respectively, n, m, p, q, r, s, t and u represent each independently an integer selected from 1 to 8, provided, when n, m, p, q, r, s, t and/or u is 2 or more, respectively, the corresponding 2 or more substituents, $R_6$, $R_7$, $R_9$, $R_{10}$, $R_{12}$, $R_{13}$, $R_{15}$, $R_{16}$, $R_{17}$, $R_{18}$, $R_{20}$, $R_{21}$, $R_{23}$, $R_{245}$, $R_{26}$ and $R_{27}$, may be the same or different group, $R_{11}$, $R_{14}$, $R_{25}$ and $R_{28}$ represent each independently hydrogen, optionally-substituted alkyl, optionally-substituted cycloalkyl or optionally-substituted phenyl, $R_{22}$ represents hydrogen, optionally-substituted alkyl, optionally-substituted cycloalkyl, optionally-substituted phenyl or optionally-substituted alkoxy, v and w represent each independently an integer of 0, 1 or 2, and X represents halogeno, a cationically polymerizable compound, and a pigment.

10. The photocurable composition according to claim 9, characterized in that the photocurable composition further comprises a radically polymerizable compound.

11. A photocurable composition comprising at least one of the iodonium salt compounds represented by a general formula (I):

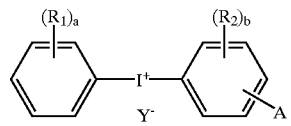

wherein $R_1$ and $R_2$ represent each independently hydrogen, optionally-substituted alkyl, optionally-substituted cycloalkyl, optionally-substituted alkoxy, or carboxyl or its ester, a and b represent each independently an integer selected from 1 to 4, provided, when a and/or b is 2 or more, respectively, the corresponding 2 or more substituents, $R_1$ and/or $R_2$, may be the same or different group, respectively, Y represents non-nucleophilic anion residue, A represents any one group selected from a group consisting of substituents represented by the following chemical formulas,

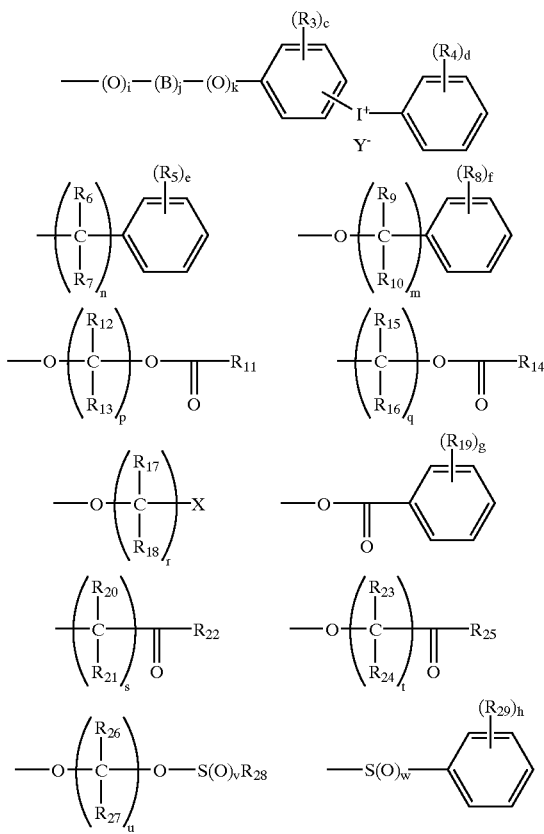

B represents optionally-substituted alkylene or optionally-substituted phenylene, i, j and k represent each independently 0 or 1, provided, i, j and k never be 0 at the same time and there is no case for i=1, j=0 and k=1, simultaneously, $R_3$, $R_4$, $R_5$, $R_8$, $R_{19}$ and $R_{29}$ represent each independently hydrogen, halogeno, optionally-substituted alkyl, optionally-substituted cycloalkyl, optionally-substituted phenyl, optionally-substituted alkoxy, optionally-substituted cycloalkoxy, optionally-substituted phenoxy, or carboxyl or its ester, $R_6$, $R_7$, $R_9$, $R_{10}$, $R_{12}$, $R_{13}$, $R_{15}$, $R_{16}$, $R_{17}$, $R_{18}$, $R_{20}$, $R_{21}$, $R_{23}$, $R_{24}$, $R_{26}$, and $R_{27}$ represent each independently hydrogen, optionally-substituted alkyl, optionally-substituted cycloalkyl or optionally-substituted phenyl, c, d, e, f, g and h represent each independently an integer selected from 1 to 5, provided, when c, d, e, f, g and/or h represent 2 or more, respectively, the corresponding 2 or more substituents, $R_3$, $R_4$, $R_5$, $R_8$, $R_{19}$ and/or $R_{29}$, may be the same or different group, respectively, n, m, p, q, r, s, t and u represent each independently an integer selected from 1 to 8, provided, when n, m, p, q, r, s, t and/or u is 2 or more, respectively, the corresponding 2 or more substituents, $R_6$, $R_7$, $R_9$, $R_{10}$, $R_{12}$, $R_{13}$, $R_{15}$, $R_{16}$, $R_{17}$, $R_{18}$, $R_{20}$, $R_{21}$, $R_{23}$, $R_{24}$, $R_{26}$ and $R_{27}$, may be the same or different group, $R_{11}$, $R_{14}$, $R_{25}$ and $R_{28}$ represent each independently hydrogen, optionally-substituted alkyl, optionally-substituted cycloalkyl or optionally-substituted phenyl, $R_{22}$ represents hydrogen, optionally-substituted alkyl, optionally-substituted cycloalkyl, optionally-substituted phenyl or optionally-substituted alkoxy, v and w represent each independently an integer of 0, 1 or 2, and X represents halogeno, a cationically polymerizable compound, and a radically polymerizable compound.

12. A photopolymerization initiator comprising at least one of diaryliodonium salt compounds represented by a general formula (I);

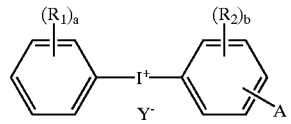

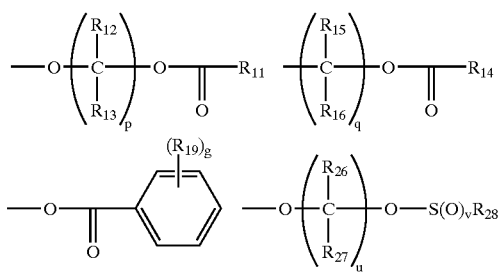

wherein $R_1$ and $R_2$ represent each independently hydrogen, optionally-substituted alkyl, optionally-substituted cycloalkyl, optionally-substituted alkoxy, or carboxyl or its ester, a and b represent each independently an integer selected from 1 to 4, provided, when a and/or b is 2 or more, respectively, the corresponding 2 or more substituents, $R_1$ and/or $R_2$, may be the same or different group, respectively, Y represents non-nucleophilic anion residue, A represents any one group selected from a group consisting of substituents represented by the following chemical formulas, $R_{19}$ represent each independently hydrogen, halogeno, optionally-substituted alkyl, optionally-substituted cycloalkyl, optionally-substituted phenyl, optionally-substituted alkoxy, optionally-substituted cycloalkoxy, optionally-substituted phenoxy, or carboxyl or its ester, $R_{12}$, $R_{13}$, $R_{15}$, $R_{16}$, $R_{26}$, and $R_{27}$ represent each independently hydrogen, optionally-substituted alkyl, optionally-substituted cycloalkyl or optionally-substituted phenyl, g represents each independently an integer selected from 1 to 5, provided, when g represents 2 or more, respectively, the corresponding 2 or more substituents, $R_{19}$ may be the same or different group, respectively, p, q, and u represent each independently an integer selected from 1 to 8, provided, when p, q, and/or u is 2 or more, respectively, the corresponding 2 or more substituents, $R_{12}$, $R_{13}$, $R_{15}$, $R_{16}$, $R_{26}$ and/or $R_{27}$, may be the same or different group, $R_{11}$, $R_{14}$, and $R_{28}$ represent each independently hydrogen, optionally-substituted alkyl, optionally-substituted cycloalkyl or optionally-substituted phenyl, and v represents each independently an integer of 0, 1 or 2.

13. A photocurable composition comprising at least one of the iodonium salt compounds represented by a general formula (I) and diaryliodonium salt compounds represented by a general formula (I);

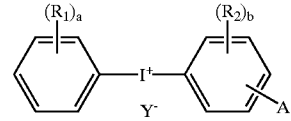

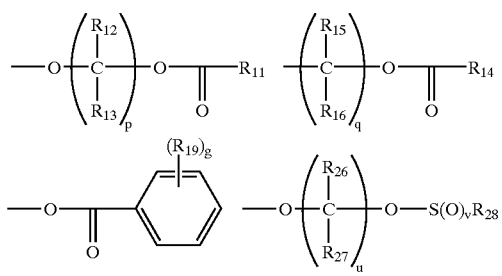

wherein $R_1$ and $R_2$ represent each independently hydrogen, optionally-substituted alkyl, optionally-substituted cycloalkyl, optionally-substituted alkoxy, or carboxyl or its ester, a and b represent each independently an integer selected from 1 to 4, provided, when a and/or b is 2 or more, respectively, the corresponding 2 or more substituents, $R_1$ and/or $R_2$, may be the same or different group, respectively, Y represents non-nucleophilic anion residue, A represents any one group selected from a group consisting of substituents represented by the following chemical formulas, $R_{19}$ represent each independently hydrogen, halogeno, optionally-substituted alkyl, optionally-substituted cycloalkyl, optionally-substituted phenyl, optionally-substituted alkoxy, optionally-substituted cycloalkoxy, optionally-substituted phenoxy, or carboxyl or its ester, $R_{12}$, $R_{13}$, $R_{15}$, $R_{16}$, $R_{26}$, and $R_{27}$ represent each independently hydrogen, optionally-substituted alkyl, optionally-substituted cycloalkyl or optionally-substituted phenyl, g represents each independently an integer selected from 1 to 5, provided, when g represents 2 or more, respectively, the corresponding 2 or more substituents, $R_{19}$ may be the same or different group, respectively, p, q, and u represent each independently an integer selected from 1 to 8, provided, when p, q, and/or u is 2 or more, respectively, the corresponding 2 or more substituents, $R_{12}$, $R_{13}$, $R_{15}$, $R_{16}$, $R_{26}$ and/or $R_{27}$, may be the same or different group, $R_{11}$, $R_{14}$, and $R_{28}$ represent each independently hydrogen, optionally-substituted alkyl, optionally-substituted cycloalkyl or optionally-substituted phenyl, and v represents each independently an integer of 0, 1 or 2.

* * * * *

UNITED STATES PATENT AND TRADEMARK OFFICE
CERTIFICATE OF CORRECTION

PATENT NO. : 6,558,871 B1
DATED : May 6, 2003
INVENTOR(S) : Eiji Takahashi et al.

It is certified that error appears in the above-identified patent and that said Letters Patent is hereby corrected as shown below:

Title page,
Item [75], Inventors, replace "Ichihara (JP)" with -- Chiba (JP) --.

Column 10,
Lines 11 through 15, replace "formula chain of Compound 17" with

--

Column 11,
Line 36, In Compound 24, replace
"H NMR ((CD$_3$)$_2$SO) δ 2.34 (3H, s, C$\underline{H}_3$ C$_6$H), 3.95, 4.31 (4H, 2t, CH$_2$), 7.09, 8.14 (4H, 2d, IC$_6$H$_4$O), 7.32, 8.07 (4H, 2d, CH$_3$C$_6$$\underline{H}_4$I)."

with --H NMR ((CD$_3$)$_2$SO) δ 2.34 (3H, s, C$\underline{H}_3$ C$_6$H$_4$), 3.95, 4.31 (4H, 2t, CH$_2$), 7.09, 8.14 (4H, 2d, IC$_6$H$_4$O), 7.32, 8.07 (4H, 2d, CH$_3$C$_6$$\underline{H}_4$I).--

Column 19,
Line 26, replace "…and WV9300…" with -- …and UV9300… --.

Columns 27 and 28,
Replace "formula chain (fifth from top)" with

--
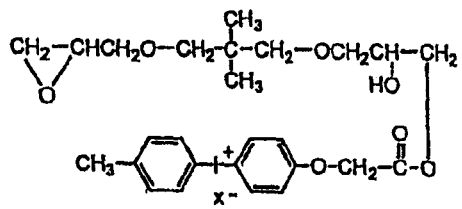

UNITED STATES PATENT AND TRADEMARK OFFICE
CERTIFICATE OF CORRECTION

PATENT NO. : 6,558,871 B1
DATED : May 6, 2003
INVENTOR(S) : Eiji Takahashi et al.

It is certified that error appears in the above-identified patent and that said Letters Patent is hereby corrected as shown below:

Columns 27 and 28 (cont'd),
Replace "formula chain (seventh from top)" with--

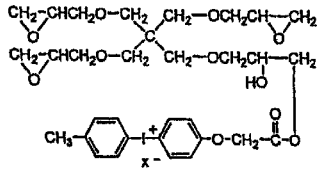

Columns 37 and 38,
Replace "formula chain (first at top)" with

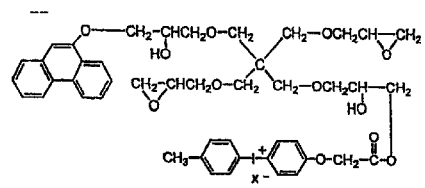

Columns 41 and 42,
Replace "formula chain (second from top)" with

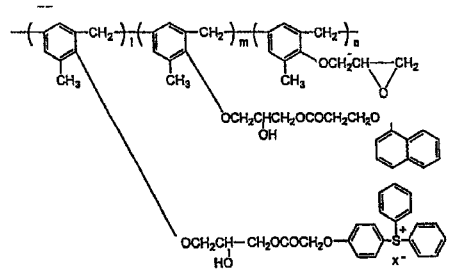

Replace "formula chain (fourth from top)" with

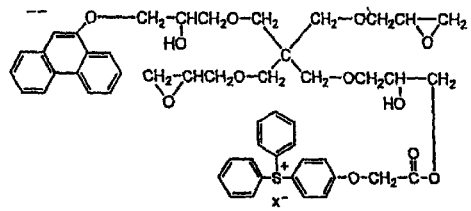

UNITED STATES PATENT AND TRADEMARK OFFICE
CERTIFICATE OF CORRECTION

PATENT NO. : 6,558,871 B1
DATED : May 6, 2003
INVENTOR(S) : Eiji Takahashi et al.

It is certified that error appears in the above-identified patent and that said Letters Patent is hereby corrected as shown below:

Columns 43 and 44,
Replace "formula chain (top of page)" with

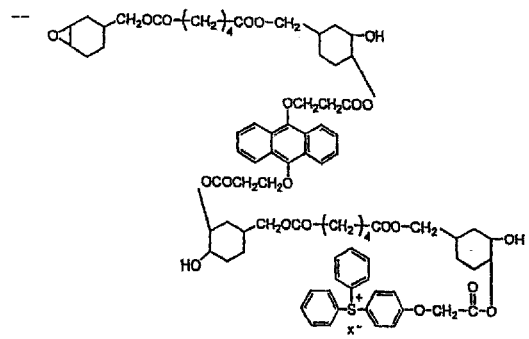

Column 55,
Line 36, replace "$R_{245}$," with -- $R_{24}$, --

Column 56,
Line 64, replace "$R_{26}$ and $R_{27}$" with -- $R_{26}$ and/or $R_{27}$ --

Signed and Sealed this

Ninth Day of September, 2003

JAMES E. ROGAN
*Director of the United States Patent and Trademark Office*